(12) United States Patent
Song et al.

(10) Patent No.: US 10,916,655 B2
(45) Date of Patent: Feb. 9, 2021

(54) FERROELECTRIC SEMICONDUCTOR DEVICE INCLUDING A FERROELECTRIC AND MANUFACTURING METHOD THEREOF

(71) Applicant: Samsung Electronics Co., Ltd., Suwon-si (KR)

(72) Inventors: Woobin Song, Suwon-si (KR); Heiseung Kim, Suwon-si (KR); Mirco Cantoro, Suwon-si (KR); Sangwoo Lee, Suwon-si (KR); Minhee Cho, Suwon-si (KR); Beomyong Hwang, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 16/591,958

(22) Filed: Oct. 3, 2019

(65) Prior Publication Data

US 2020/0365733 A1 Nov. 19, 2020

(30) Foreign Application Priority Data

May 13, 2019 (KR) .................. 10-2019-0055727

(51) Int. Cl.
*H01L 29/78* (2006.01)
*H01L 29/66* (2006.01)
*H01L 29/51* (2006.01)
*H01L 29/161* (2006.01)
*H01L 21/02* (2006.01)
*H01L 21/28* (2006.01)

(52) U.S. Cl.
CPC ........ *H01L 29/7848* (2013.01); *H01L 29/161* (2013.01); *H01L 29/516* (2013.01); *H01L 29/517* (2013.01); *H01L 29/6684* (2013.01); *H01L 21/02* (2013.01); *H01L 21/28* (2013.01); *H01L 29/78* (2013.01)

(58) Field of Classification Search
CPC . H01L 29/7848; H01L 29/161; H01L 29/516; H01L 29/517; H01L 29/6684; H01L 29/66; H01L 29/78; H01L 29/78391; H01L 21/02; H01L 21/326
USPC ............... 257/295, E21.436, E27.124; 438/3
See application file for complete search history.

(56) References Cited

U.S. PATENT DOCUMENTS

| | | |
|---|---|---|
| 8,216,906 B2 | 7/2012 | Tsai et al. |
| 9,293,534 B2 | 3/2016 | Tsai et al. |
| 9,679,893 B2 | 6/2017 | Yan et al. |
| 9,768,256 B2 | 9/2017 | Tsai et al. |

(Continued)

FOREIGN PATENT DOCUMENTS

KR 101646849 B1 8/2016

*Primary Examiner* — Thinh T Nguyen
(74) *Attorney, Agent, or Firm* — Harness, Dickey & Pierce, P.L.C.

(57) ABSTRACT

A ferroelectric semiconductor device includes an active region extending in one direction, a gate insulating layer crossing the active region, a ferroelectric layer disposed on the gate insulating layer and including a hafnium oxide, a gate electrode layer disposed on the ferroelectric layer, and source/drain regions disposed on the active region to be adjacent to both sides of the gate insulating layer, wherein the ferroelectric layer includes 20% or more of orthorhombic crystals, and an upper surface of the source/drain region is located at a level equal to or higher than an upper surface of the ferroelectric layer.

20 Claims, 15 Drawing Sheets

(56) References Cited

U.S. PATENT DOCUMENTS

| | | |
|---|---|---|
| 9,978,868 B2 | 5/2018 | Lai et al. |
| 10,056,463 B2 | 8/2018 | Xing et al. |
| 10,153,344 B2 | 12/2018 | Tsai et al. |
| 2005/0059172 A1* | 3/2005 | Kim .................... H01L 29/6684 257/295 |
| 2011/0241091 A1 | 10/2011 | Dubourdieu et al. |
| 2018/0090591 A1 | 3/2018 | Ando et al. |
| 2019/0019800 A1 | 1/2019 | Yoo et al. |

* cited by examiner

FERROELECTRIC SEMICONDUCTOR DEVICE INCLUDING A FERROELECTRIC AND MANUFACTURING METHOD THEREOF

CROSS-REFERENCE TO RELATED APPLICATION

This application claims from Korean Patent Application No. 10-2019-0055727, filed on May 13, 2019, the disclosure of which is incorporated herein by reference in its entirety.

BACKGROUND

1. Field

Apparatuses and methods consistent with example embodiments relate to semiconductor devices including a ferroelectric material and methods of manufacturing the same.

2. Description of Related Art

Ferroelectric materials refer to materials having a spontaneous electric polarization in a state in which no external electric field is applied thereto. In addition, the ferroelectric materials may be controlled to maintain either of two stable residual polarizations on a hysteresis curve by application of an external electric field. Negative capacitance field effect transistors (NCFETs) using such ferroelectric materials have been proposed.

SUMMARY

Some example embodiments of the inventive concepts are directed to providing a negative capacitance field effect transistor (NCFET) including a ferroelectric material.

In addition, some example embodiments of the inventive concepts are directed to providing a method of manufacturing an NCFET including a ferroelectric material.

According to example embodiments, there is provided a ferroelectric semiconductor device including an active region disposed on a substrate, a gate insulating layer disposed on the active region, a ferroelectric layer disposed on the gate insulating layer and including an oxide, a gate electrode layer disposed on the ferroelectric layer, a gate spacer configured to cover both side surfaces of the gate insulating layer, the ferroelectric layer, and the gate electrode layer, and source/drain regions disposed on the active region to be adjacent to both sides of the gate spacer. The oxide is hafnium oxide ($HfO_2$) or $Hf_aLr_{1-a}O_b$ (here, [a]=0.2 to 0.8 and [b]=2 to 4), and the oxide is doped with at least one of 3 to 8 mol % of aluminum (Al), 2 to 10 mol % of silicon (Si), 2 to 10 mol % of iridium (Y), 1 to 7 mol % of lanthanum (La), and 1 to 7 mol % of gadolinium (Gd), the ferroelectric layer includes 20% or more of orthorhombic crystals, and an upper surface of the source/drain region is located at a level substantially equal to or higher than that of an upper surface of the ferroelectric layer.

According to example embodiments, there is provided a ferroelectric semiconductor device including an active region extending in one direction, a gate structure crossing the active region, a gate spacer covering both sidewalls of the gate structure, and source/drain regions disposed on both sides of the gate spacer. The gate structure includes an interface layer in contact with the active region, a gate electrode layer disposed on the interface layer, and a gate insulating layer and a ferroelectric layer disposed between the interface layer and the gate electrode layer, the gate insulating layer and the ferroelectric layer extend along an inner sidewall of the gate spacer and have a U-shaped cross section, the ferroelectric layer includes an oxide, the oxide is hafnium oxide ($HfO_2$) or $Hf_aZr_{1-a}O_b$ (here, [a]=0.2 to 0.8 and [b]=2 to 4), the oxide is doped with at least one of 3 to 8 mol % of aluminum (Al), 2 to 10 mol % of silicon (Si), 2 to 10 mol % of iridium (Y), 1 to 7 mol % of lanthanum (La), and 1 to 7 mol % of gadolinium (Gd), and an upper surface of the source/drain region is located at a level between an upper end and a bottom surface of the ferroelectric layer.

According to example embodiments, there is provided a method of manufacturing a ferroelectric semiconductor device including providing a substrate having an active region, forming a gate insulating layer on the active region, forming an amorphous ferroelectric layer including hafnium oxide on the gate insulating layer, forming a gate electrode layer on the ferroelectric layer, forming a trench in the active region to be adjacent to both sides of the gate insulating layer, and forming an embedded stressor in the trench and converting the amorphous ferroelectric layer into a crystalline ferroelectric layer. The forming of the amorphous ferroelectric layer includes at least one of doping the hafnium oxide with 3 to 8 mol % of aluminum (Al) and annealing in a range from 800 to 1,000° C., doping the hafnium oxide with 2 to 10 mol % of silicon (Si) and annealing in a range from 650 to 1,000° C., doping the hafnium oxide with 2 to 10 mol % of iridium (Y) and annealing in a range from 600 to 1,000° C., or doping the hafnium oxide with 1 to 7 mol % of gadolinium (Gd) and annealing in a range from 450 to 800° C. In the ferroelectric semiconductor device, a vertical height of an upper surface of the embedded stressor from an upper end of the active region ranges from 1 to 25 nm.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Hereinafter, some example embodiments of the inventive concepts will be described in detail with reference to the accompanying drawings It will be understood that an element that is "on" another element may be above or below the other element. It will be further understood that an element that is "on" another element may be "directly" on the other element, such that the elements are in direct contact with each other, or may be "indirectly" on the other element, such that the elements are isolated from direct contact with each other by one or more interposing spaces and/or structures.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

It will be understood that, when the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 1:
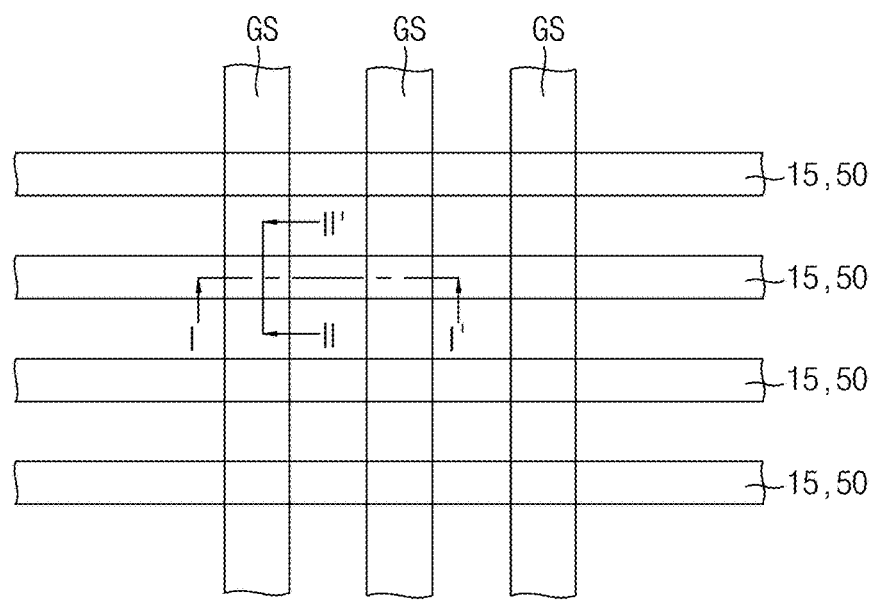
FIG. 1 is a schematic plan view of a semiconductor device according to some example embodiments.
Figure 2:
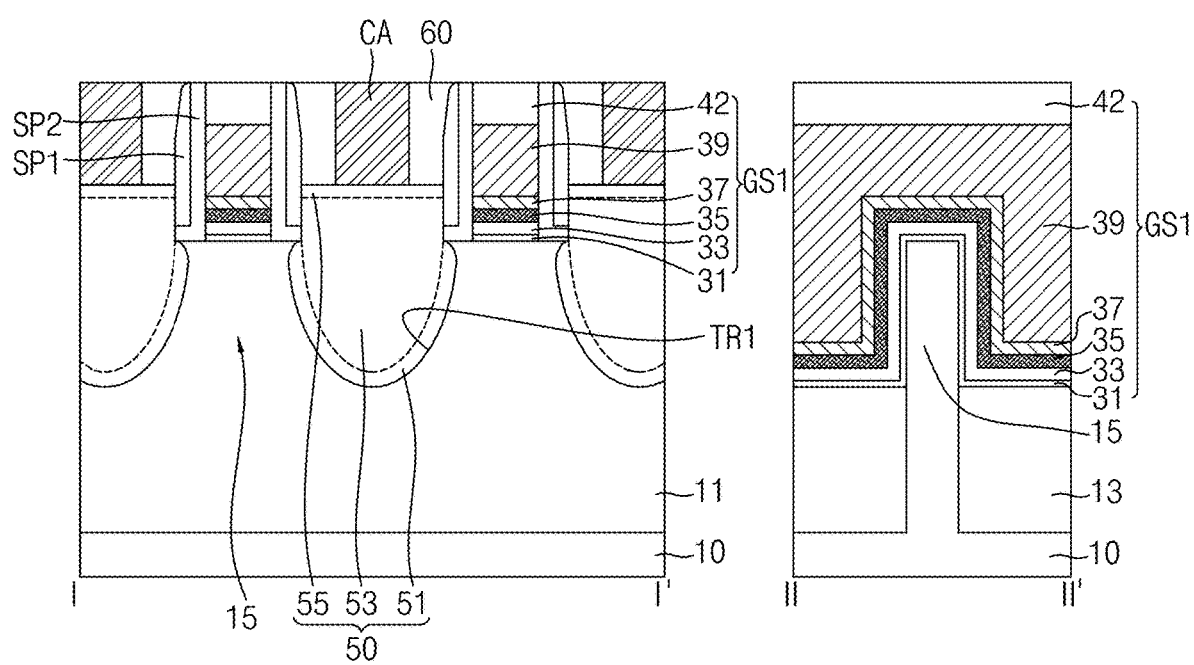
FIG. 2 shows cross-sectional views taken along lines I-I' and II-II' of FIG. 1 of a semiconductor device according to some example embodiments.
Figure 3:
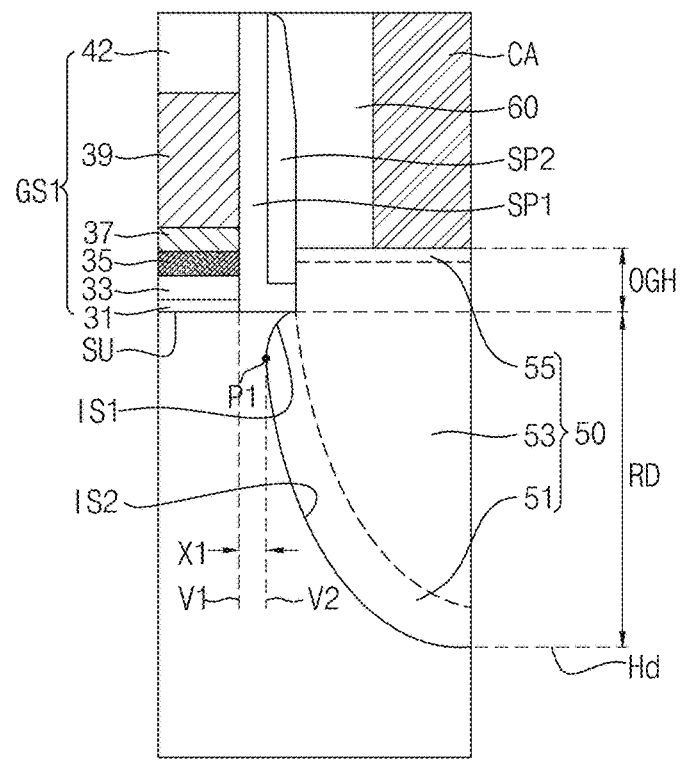
FIG. 3 is an enlarged cross-sectional view showing a region of FIG. 2.

FIG. 1 is a schematic plan view of a semiconductor device according to some example embodiments. FIG. 2 shows cross-sectional views taken along lines I-I' and II-II' of FIG. 1 of a semiconductor device according to some example embodiments. FIG. 3 is an enlarged cross-sectional view showing a region of FIG. 2.

Referring to FIG. 1, a semiconductor device may include active regions 15 and gate structures GS. The active regions 15 may be parallel to each other. The gate structures GS may be disposed parallel to each other and may cross the active regions 15. The active regions 15 may have various sizes and shapes. Source/drain regions 50 may be disposed between the gate structures GS.

Referring to FIGS. 2 and 3, a semiconductor device may include a substrate 10, a well region 11, active regions 15, a device isolation layer 13, trenches TR1, source/drain regions 50, gate structures GS1, gate spacers SP1 and SP2, an interlayer insulating layer 60, and source/drain contacts CA.

The substrate 10 may include a single crystalline semiconductor substrate such as a silicon wafer. The active region 15 may be a fin-type active region. The active region 15 may be formed to protrude in the well region 11 formed in a predetermined region of the substrate 10. For example, the active region 15 may include single crystalline silicon with N-type impurities or P-type impurities.

The device isolation layer 13 may be disposed on both sides of the active region 15 on the substrate 10. An upper portion of the active region 15 may be exposed due to the device isolation layer 13. An upper surface of the device isolation layer 13 may be located at a lower level than an upper end of the active region 15. The device isolation layer 13 may include oxide, nitride, oxynitride, or a combination thereof.

The gate structures GS1 may cross the active regions 15 on the device isolation layer 13. The gate structure GS1 may include an interface layer 31, a gate insulating layer 33, a ferroelectric layer 35, a barrier layer 37, a gate electrode layer 39, and a gate capping layer 42.

The interface layer 31 may be disposed on the active regions 15. In an example embodiment, the interface layer 31 may have the same lattice structure as the substrate 10 and the active region 15 or may have a different lattice constant from the substrate 10 and the active region 15. For example, the interface layer 31 may include silicon oxide. The interface layer 31 may be omitted. The gate insulating layer 33 may be disposed on the interface layer 31. The gate insulating layer 33 may include silicon oxide, silicon nitride, silicon oxynitride, a high-k dielectric material, or a combination thereof.

The ferroelectric layer 35 may be disposed on the gate insulating layer 33. The ferroelectric layer 35 may include hafnium oxide ($HfO_2$). In an example embodiment, the ferroelectric layer 35 including hafnium oxide ($HfO_2$) may further include a metallic element impurity. For example, the ferroelectric layer 35 may include hafnium oxide ($HfO_x$) which is doped with 3 to 8 mol % of aluminum (Al), 2 to 10 mol % of silicon (Si), 2 to 10 mol % of iridium (Y), or 1 to 7 mol % of gadolinium (Gd). Alternatively, the ferroelectric layer 35 may include $Hf_aZr_{1-a}O_b$ (here, [a]=0.2 to 0.8 and [b]=2 to 4). In an example embodiment, a thickness of the ferroelectric layer 35 including hafnium oxide ($HfO_x$) may be 10 nm or less. The barrier layer 37 may be disposed on the ferroelectric layer 35. For example, the barrier layer 37 may include TiN, TaN, TiAl, or TiAlC. The gate electrode layer 39 may be disposed on the barrier layer 37. The gate electrode layer 39 may include a metal such as W. The gate capping layer 42 may be disposed on the gate electrode layer 39. The gate capping layer 42 may include at least one of silicon nitride and silicon oxynitride.

A first gate spacer SP1 and a second gate spacer SP2 may cover both sidewalls of the gate structure GS1. The first gate spacer SP1 and the second gate spacer SP2 may be disposed on both sidewalls of the interface layer 31, the gate insulating layer 33, the ferroelectric layer 35, the barrier layer 37, the gate electrode layer 39, and the gate capping layer 42. The first gate spacer SP1 and the second gate spacer SP2 may include silicon oxide, silicon nitride, silicon oxynitride, or a combination thereof. For example, the first gate spacer SP1 may include silicon oxide and the second gate spacer SP2 may include silicon nitride.

The trenches TR1 may be formed between the active regions 15 and between the gate structures GS1. The trench TR1 may have a round cross section. However, the inventive concepts are not limited thereto, and the active region 15 and/or trench TR 2 may have different cross sections or profiles. The trench TR1 may include an upper inner wall IS1 and a lower inner wall IS2. The upper inner wall IS1 may extend farther downward from an inner side of the gate structure GS1 adjacent thereto farther away from an upper surface SU of the active region 15. The lower inner wall IS2 may extend farther downward from an outer side of the gate structure GS1 adjacent thereto farther away from the upper surface SU of the active region 15.

The source/drain region 50 may be disposed in the trench TR1. The source/drain region 50 may be in contact with the upper inner wall IS1 and the lower inner wall IS2 of the trench TR1. The source/drain region 50 may be formed along an inner wall of the trench TR1 to have a rounded cross section. A portion P1 of the source/drain region 50 protruding most in an inward direction of the gate structure GS1 adjacent thereto may be formed at a position at which the upper inner wall IS1 and the lower inner wall IS2 of the trench TR1 meet. In an example embodiment, a lateral distance X1 between a first vertical line V1, which is perpendicular to a surface of the substrate 10 and aligned with an outer sidewall of the gate electrode layer 39 (or, an inner sidewall of the first gate spacer SP1), and a second vertical line V2, which is perpendicular to the surface of the substrate 10 and passes through the most protruding portion P1 of the source/drain region 50, may range from −3 to +5 nm.

When the lateral distance X1 is zero, the most protruding portion P1 of the source/drain region 50 may be located on the first vertical line V1. When the lateral distance X1 is less than zero, the most protruding portion P1 of the source/drain region 50 may vertically overlap a lower portion of the gate electrode layer 39. When the lateral distance X1 is greater than zero, the most protruding portion P1 of the source/drain region 50 may vertically overlap the first gate spacer SP1.

A vertical depth RD of a lower end of the source/drain region 50 from the upper surface SU of the active region 15 may range from 40 to 64 nm. That is, a vertical distance between the upper surface SU of the active region 15 and a lateral line Hd aligned with a bottom surface of the trench TR1 may range from 40 to 64 nm.

In an example embodiment, an upper surface of the source/drain region 50 may be located at a level equal to or higher than an upper surface of the ferroelectric layer 35. For example, a vertical height OGH of the upper surface of the source/drain region 50 from the upper surface SU of the active region 15 may range from 1 to 25 nm and the upper surface of the source/drain region 50 may be located at a level equal to or higher than the upper surface of the ferroelectric layer 35.

In an example embodiment, when the active region 15 includes an N-type impurity, the source/drain region 50 may include a first epitaxial layer 51, a second epitaxial layer 53, and a third epitaxial layer 55. The first epitaxial layer 51 may include undoped single crystalline SiGe formed by a selective epitaxial growth (SEG) method. In an example embodiment, a Ge content of the first epitaxial layer 51 may range from 25 to 35 atom %. The first epitaxial layer 51 may conformally cover the inner wall of the trench TR1. The first epitaxial layer 51 may cover the upper inner wall IS1 and the lower inner wall IS2.

The second epitaxial layer 53 may be formed on the first epitaxial layer 51 in the trench TR1. The second epitaxial layer 53 may include single crystalline SiGe doped with boron (B), which is formed by an SEG method. A Ge content of the second epitaxial layer 53 may be higher than that of the first epitaxial layer 51. In an example embodiment, the Ge content of the second epitaxial layer 53 may range from 50 to 70 atom %. The second epitaxial layer 53 may fully fill the trench TR1. An upper surface of the second epitaxial layer 53 may be located at a level equal to or higher than the upper surface SU of the active region 15. The second epitaxial layer 53 may be in contact with an outer sidewall of the second gate spacer SP2. In an example embodiment, the upper surface of the second epitaxial layer 53 may be located at a higher level than a lower surface of the ferroelectric layer 35.

The third epitaxial layer 55 may include SiGe or Si. The third epitaxial layer 55 may include a P-type impurity. For example, the third epitaxial layer 55 may include boron (B). A Ge content of the third epitaxial layer 55 may range from 0 to 10 atom %. For example, the third epitaxial layer 55 may include single crystalline silicon. The third epitaxial layer 55 may be omitted.

A lattice constant of the first epitaxial layer 51 may be greater than that of the active region 15. A lattice constant of the second epitaxial layer 53 may be greater than that of the active region 15. The lattice constant of the second epitaxial layer 53 may be greater than that of the first epitaxial layer 51. Accordingly, the source/drain region 50 may apply a compressive strain to the active region 15 portion below the gate electrode layer 39. In an example embodiment, the second epitaxial layer 53 may apply a compressive strain to the active region 15 (i.e., a channel region) and the gate structure GS1. Accordingly, a compressive strain may also be applied to the ferroelectric layer 35. When the level of the second epitaxial layer 53 is equal to or higher than that of the ferroelectric layer 35, a compressive strain may be applied to the ferroelectric layer 35. At least a portion of the ferroelectric layer 35 to which the compressive strain is applied may be converted from an amorphous phase into a crystalline phase. In one example embodiment, a compressive strain ranging from 1 to 4.5 Gpa may be applied to the ferroelectric layer 35. In another example embodiment, a compressive strain ranging from 2 to 4.5 Gpa may be applied to the ferroelectric layer 35. A proportion of orthorhombic crystals of the ferroelectric layer 35 may be 20% or more by volume. The ferroelectric layer 35 including orthorhombic crystals may have stable ferroelectric characteristics. Accordingly, operating characteristics of a negative capacitance field effect transistor (NCFET) may be improved.

In an example embodiment, the source/drain region 50 may have a lateral distance X1 ranging from −3 to +5 nm, a vertical depth RD ranging from 40 to 64 nm, and a vertical height OGH ranging from 1 to 25 nm. When a Ge content of the first epitaxial layer 51 ranges from 25 to 35 atom % and a Ge content of the second epitaxial layer 53 ranges from 50 to 70 atom %, a sufficient strain may be applied to the ferroelectric layer 35 and a proportion of orthorhombic crystals of the ferroelectric layer 35 may be 20% or more. In an example embodiment, when the active region 15 includes a P-type impurity, the source/drain region 50 may include single crystalline silicon (Si) doped with phosphorus (P) or single crystalline silicon (Si) doped with carbon (C), which is formed by an SEG method. For example, a phosphorus (P) doping concentration of the source/drain region 50 may range from 5 to 10 atom %. Alternatively, a carbon (C) doping concentration of the source/drain region 50 may range from 0.5 to 2 atom %. The source/drain region 50 including the single crystalline silicon doped with phosphorus (P) or carbon (C) may apply a tensile strain to the active region 15 (i.e., the channel region) and the gate structure GS1. When a level of the upper surface of the source/drain region 50 is equal to or higher than a level of the ferroelectric layer 35, the source/drain region 50 may also apply the tensile strain to the ferroelectric layer 35. At least a portion of the ferroelectric layer 35 to which the tensile strain is applied may be converted from an amorphous phase into a crystalline phase. In one example embodiment, a tensile strain ranging from 1 to 4.5 Gpa may be applied to the ferroelectric layer 35. In another example embodiment, a tensile strain ranging from 2 to 4.5 Gpa may be applied to the ferroelectric layer 35. A proportion of orthorhombic crystals of the ferroelectric layer 35 may be 20% or more. The ferroelectric layer 35 including orthorhombic crystals at a proportion of 20% or more may have stable ferroelectric characteristics. Accordingly, the operating characteristics of the NCFET may be improved.

In an example embodiment, the source/drain region 50 may have a lateral distance X1 of −3 ranging from +5 nm, a vertical depth RD ranging from 40 to 64 nm, and a vertical height OGH ranging from 1 to 25 nm. When a phosphorus (P) doping concentration of the source/drain region 50 ranges from 0.5 to 2 atom % or a carbon (C) doping concentration of the source/drain region 50 ranges from 0.5 to 2 atom %, a sufficient strain may be applied to the ferroelectric layer 35 and a proportion of orthorhombic crystals of the ferroelectric layer 35 may be 20% or more.

The interlayer insulating layer 60 may cover the source/drain region 50 and the gate structure GS1. For example, the interlayer insulating layer 60 may include at least one of silicon oxide, silicon nitride, silicon oxynitride, and a low-k dielectric material. The source/drain contact CA may be disposed on the source/drain region 50 to pass through the interlayer insulating layer 60. The source/drain contact CA may be formed of a conductive material. The source/drain contact CA may include, for example, W, Al, Cu, or the like.

Figure 4A:
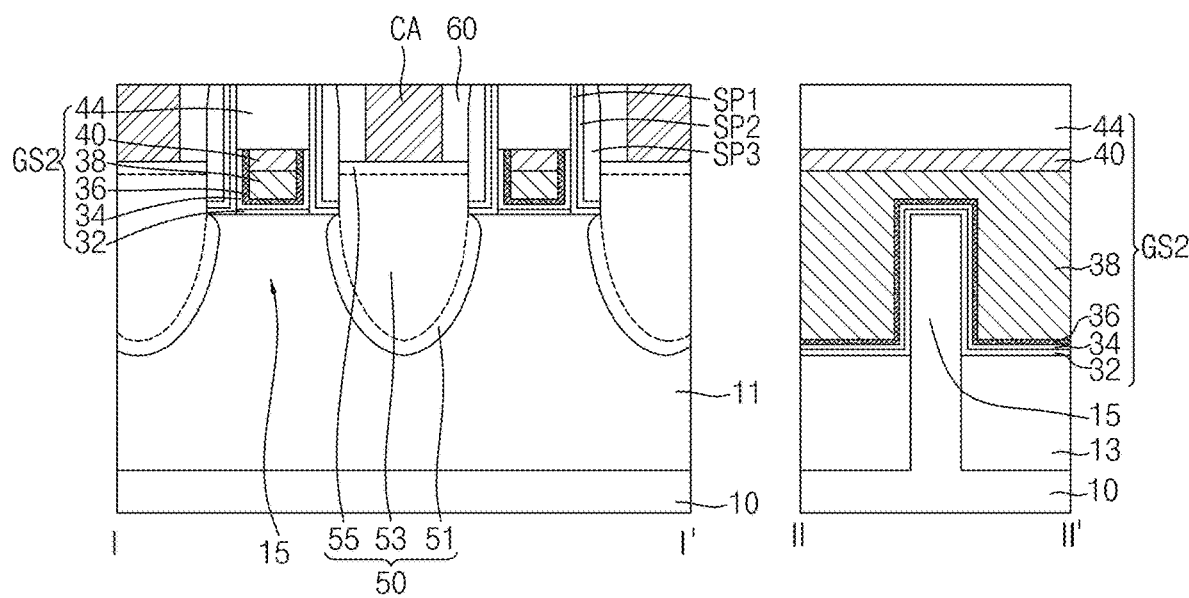
FIG. 4A shows cross-sectional views taken along lines I-I' and II-II' of FIG. 1 of a semiconductor device according to some example embodiments.
Figure 4B:
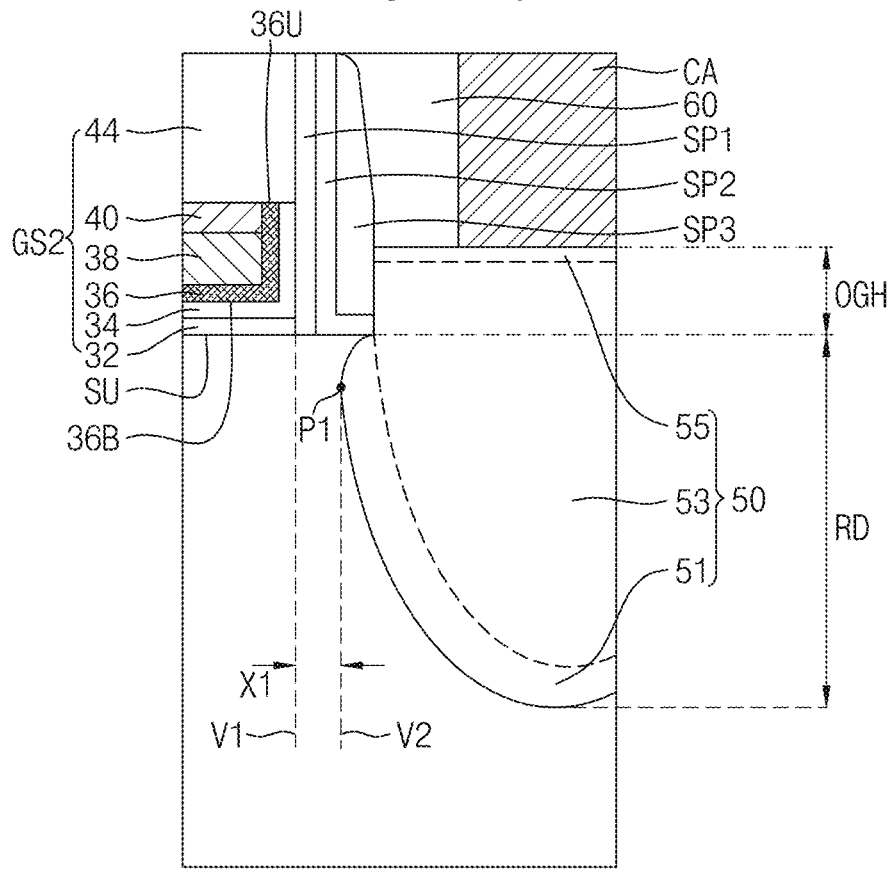
FIG. 4B is an enlarged cross-sectional view showing a region of FIG. 4A.

FIG. 4A shows cross-sectional views taken along lines I-I' and II-II' of FIG. 1 of a semiconductor device according to some example embodiments. FIG. 4B is an enlarged cross-sectional view showing a region of FIG. 4A. In FIGS. 1 to 4B, like reference numerals denote like elements. Hereinafter, substantially the same contents as those described in FIGS. 1 to 3 will be omitted and differences therebetween will be described in detail.

Referring to FIGS. 4A and 4B, a gate structure GS2 may include an interface layer 32, a gate insulating layer 34, a ferroelectric layer 36, a first gate electrode layer 38, a second gate electrode layer 40, a gate capping layer 44, a first gate spacer SP1, a second gate spacer SP2, and a third gate spacer SP3. The gate structure GS2 may be formed by a gate-last process such as a replacement metal gate (RMG) process.

The interface layer 32 may be disposed on a substrate 10 so as to be in direct contact with the substrate 10. The interface layer 32 may be formed by an SEG method. The interface layer 32 may include, for example, silicon carbide (SiC) or silicon germanium (SiGe). In an example embodiment, a thickness of the interface layer 32 may be less than or equal to a critical thickness. For example, the thickness of the interface layer 32 may range from 0.1 to 2.5 nm. The interface layer 32 having the thickness less than or equal to the critical thickness which is formed on the substrate 10 may be fully strained. A lattice constant of the interface layer 32 may be the same as a lattice constant of the substrate 10.

The gate insulating layer 34 and the ferroelectric layer 36 may be disposed on the interface layer 32 and may extend upward along an inner sidewall of the first gate spacer SP1. The gate insulating layer 34 and the ferroelectric layer 36 may have a U-shaped cross section when viewed along the direction in FIG. 4A so as to surround side surfaces of the first gate electrode layer 38 and the second gate electrode layer 40. The ferroelectric layer 36 may include hafnium oxide ($HfO_2$). In an example embodiment, the ferroelectric layer 36 including hafnium oxide ($HfO_2$) may further include a metallic element impurity. For example, the ferroelectric layer 36 may include an oxide, and the oxide may be hafnium oxide ($HfO_x$) which is doped with 3 to 8 mol % of aluminum (Al), 2 to 10 mol % of silicon (Si), 2 to 10 mol % of iridium (Y), or 1 to 7 mol % of gadolinium (Gd). Alternatively, the oxide in the ferroelectric layer 36 may include $Hf_aZr_{1-a}O_b$ (here, [a]=0.2 to 0.8 and [b]=2 to 4).

The gate insulating layer 34 may be in contact with an upper surface of the interface layer 32 and the inner sidewall of the first gate spacer SP1. The ferroelectric layer 36 may be in contact with an upper surface and an inner sidewall of the gate insulating layer 34. An upper end of the gate insulating layer 34 and an upper end 36U of the ferroelectric layer 36 may be located at the same level.

The first gate electrode layer 38 may be disposed on the ferroelectric layer 36. A lower surface and a side surface of the first gate electrode layer 38 may be in contact with ferroelectric layer 36. An upper surface of the first gate electrode layer 38 may be located at a lower level than the upper end 36U of the ferroelectric layer 36. For example, the first gate electrode layer 38 may include TiN, TaN, TiAl, or TiAlC. The second gate electrode layer 40 may be formed on the first gate electrode layer 38. A lower surface of the second gate electrode layer 40 may be in contact with the first gate electrode layer 38 and a side surface of the second gate electrode layer 40 may be in contact with the ferroelectric layer 36. An upper surface of the second gate electrode layer 40 may be located at the same level as the upper end 36U of the ferroelectric layer 36. For example, the second gate electrode layer 40 may include a metal such as W.

The gate capping layer 44 may be disposed on the second gate electrode layer 40. The gate capping layer 44 may cover the upper surface of the second gate electrode layer 40, the upper end 36U of the ferroelectric layer 36, and the upper end of the gate insulating layer 34. The gate capping layer 44 may include at least one of silicon nitride and silicon oxynitride.

The first to third gate spacers SP1, SP2, and SP3 may be disposed on both sidewalls of the interface layer 32, the gate insulating layer 34, the ferroelectric layer 36, the first gate electrode layer 38, the second gate electrode layer 40, and the gate capping layer 44. The first to third gate spacers SP1, SP2, and SP3 may include silicon oxide, silicon nitride, silicon oxynitride, or a combination thereof. The first gate spacer SP1 may be in contact with side surfaces of the interface layer 32, the gate insulating layer 34, and the gate capping layer 44. Both sidewalls of the first gate spacer SP1 may be perpendicular. The second gate spacer SP2 may extend laterally toward a source/drain region 50 on a surface of an active region 15. For example, the second gate spacer SP2 may have an L-shaped cross section when viewed along the direction in FIG. 4A. The third gate spacer SP3 may be formed on an outer sidewall of the second gate spacer SP2. The third gate spacer SP3 may have a small upper width and a large lower width.

An upper surface of the source/drain region 50 may be located at a level between a bottom surface 36B and the upper end 36U of the ferroelectric layer 36. The source/drain region 50 may have the same or similar characteristics as the source/drain region 50 described in FIGS. 1 and 2. The source/drain region 50 may apply a strain to the active region 15, that is, a channel region, and the interface layer 32. The strain applied to the interface layer 32 may be applied up to the ferroelectric layer 36. At least a portion of the ferroelectric layer 36 to which a compressive strain is applied may be converted from an amorphous phase into a crystalline phase. A proportion of orthorhombic crystals of the ferroelectric layer 36 may be 20% or more. The ferroelectric layer 36 including orthorhombic crystal may have stable ferroelectric characteristics. Accordingly, operating characteristics of an NCFET may be improved.

Figure 5:
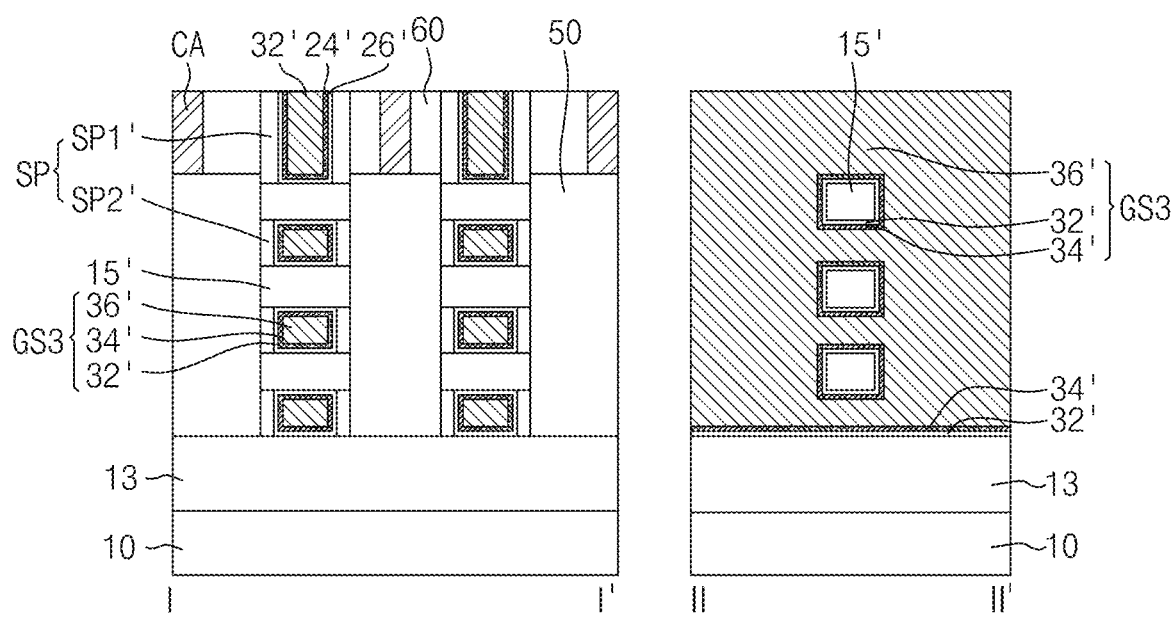
FIG. 5 shows cross-sectional views taken along lines I-I' and II-IF of FIG. 1 of a semiconductor device according to some example embodiments.

FIG. 5 shows cross-sectional views taken along lines I-I' and II-II' of FIG. 1 of a semiconductor device according to some example embodiments. In FIGS. 2, 3, and 5, like reference numerals denote like elements. Hereinafter, substantially the same contents as those described in FIGS. 2 and 3 will be omitted and differences therebetween will be described.

Referring to FIG. 5, a semiconductor device may include active regions 15', gate structures GS3, spacers SP, source/drain regions 50', an interlayer insulating layer 60, and source/drain contacts CA. The semiconductor device according to the example embodiment may be a gate all around field effect transistor (FET).

The active region 15' may include a plurality of channel layers which are disposed on a substrate 10 to be spaced apart from each other in a vertical direction. The plurality of channel layers may be a wire-shaped pattern extending in one direction. For example, the plurality of channel layers may have various cross section shapes such as a quadrangular shape, a circular shape, and the like. The plurality of channel layers may include one of SiGe and Ge, but the inventive concepts are not limited thereto.

The gate structure GS3 may be formed to surround a periphery of the plurality of channel layers. The gate structure GS3 may include a gate insulating layer 32', a ferroelectric layer 34', and a gate electrode layer 36'. The gate insulating layer 32', the ferroelectric layer 34', and the gate electrode layer 36' may be formed to surround the plurality of channel layers which are spaced apart from each other in the vertical direction. The gate insulating layer 32', the ferroelectric layer 34', and the gate electrode layer 36' may include the same material as the gate structures GS1 and GS2 described above.

The spacer SP may include an outer side spacer SP1' and an inner side spacer SP2'. The outer side spacer SP1' may be disposed on the active region 15'. The outer side spacer SP1' may be in contact with the interlayer insulating layer 60. The inner side spacer SP2' may be disposed between the plurality of channel layers, which are vertically spaced apart from each other, below the outer side spacer SP1'.

Figure 6:
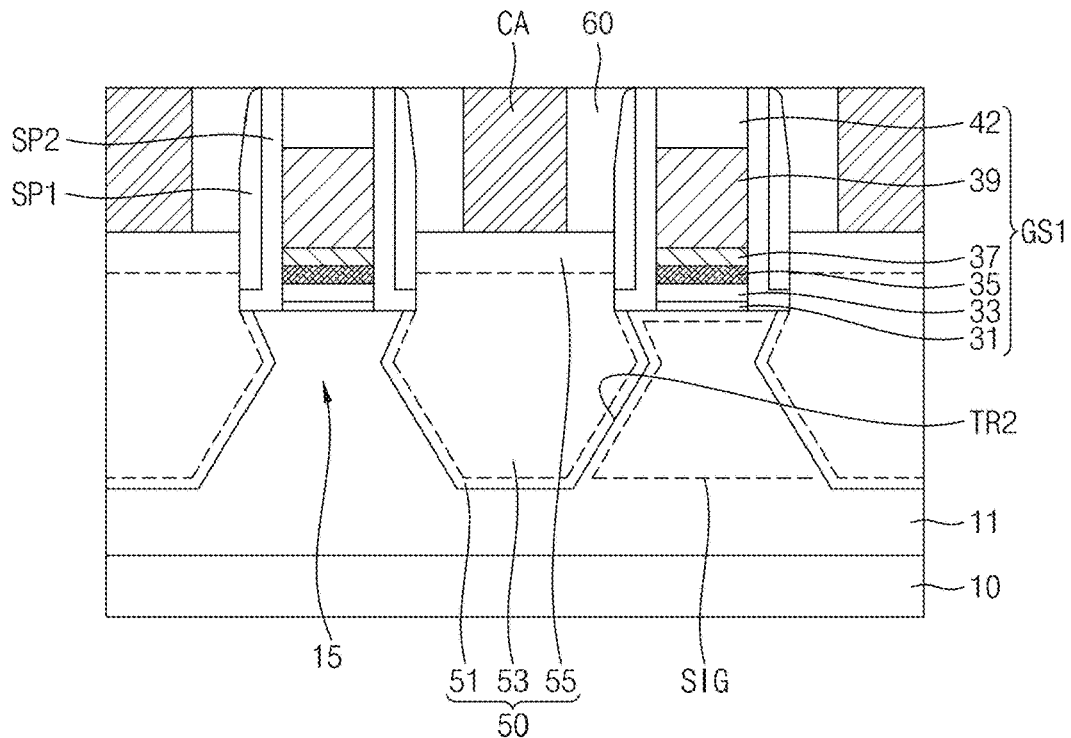
FIG. 6 is a cross-sectional view of a semiconductor device according to some example embodiments.
Figure 7:
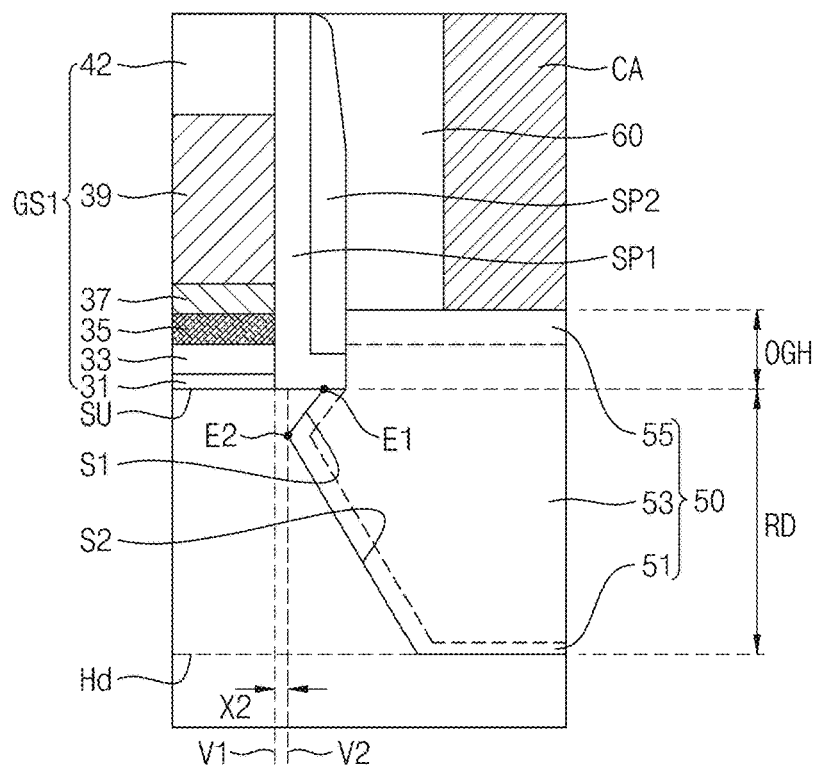
FIG. 7 is an enlarged cross-sectional view showing a region of FIG. 6.

FIG. 6 is a cross-sectional view of a semiconductor device according to some example embodiments. FIG. 7 is an enlarged cross-sectional view showing a region of FIG. 6. In FIGS. 2, 3, 6, and 7, like reference numerals denote like elements. Hereinafter, substantially the same contents as those described in FIGS. 2 and 3 will be omitted and differences therebetween will be described.

Referring to FIGS. 6 and 7, in an example embodiment, a trench TR2 may have a side surface having a sigma ($\Sigma$) shaped profile or a notch shaped profile when viewed along the direction in FIG. 6. Accordingly, due to the trench TR2, an active region 15 may have a sigma ($\Sigma$) shaped profile. The sigma shaped profile SIG may be seen in FIG. 6. However, the inventive concepts are not limited thereto, and the active region 15 and/or trench TR 2 may have different shapes and/or profiles.

The trench TR2 may include a first side surface 51 and a second side surface S2. A source/drain region 50 may be in direct contact with the first side surface 51 and the second side surface S2. The first side surface 51 may be connected to an upper surface SU of the active region 15. A first edge E1 may be formed between the upper surface SU of the active region 15 and the first side surface 51. The first side surface 51 may extend downward to an inner side of the gate structure GS1 from the upper surface SU of the active region 15. The second side surface S2 may be located at a lower level than the first side surface 51. The second side surface S2 may be connected to a lower end of the first side surface 51, and a second edge E2 may be formed between the first side surface 51 and the second side surface S2. The second side surface S2 may extend downward to an outer side of the gate structure GS1 from the lower end of the first side surface 51. When the upper surface SU of the active region 15, the first edge E1, the first side surface S1, the second edge E2, the second side surface S2, and a lateral line Hd of a bottom surface of the trench TR2 are connected to each other, a sigma ($\Sigma$) shaped profile may be formed.

In an example embodiment, a lateral distance X2 between a first vertical line V1, which is perpendicular to a surface of the substrate 10 and passes through a side surface of a gate electrode layer 39, and a second vertical line V2, which is perpendicular to the surface of the substrate 10 and passes through the second edge E2, may range from −3 nm to +5 nm. When the lateral distance is zero, the second edge E2 may be located on the first vertical line V1. When the lateral distance is less than zero, the second edge E2 may vertically overlap a lower portion of the gate electrode layer 39, and when the lateral distance is greater than zero, the second edge E2 may vertically overlap a first gate spacer SP1. The source/drain region 50 may have a portion which protrudes most in an inward direction of the gate structure GS1 and is in contact with the second edge E2. A shortest lateral distance between the most protruding portion of the source/drain region 50 and the first vertical line V1 may range from −3 nm to +5 nm. In an example embodiment, a depth RD of a lower surface of the trench TR2 from an upper surface of the active region 15 may range from 40 to 64 nm. That is, a vertical distance between the upper surface SU of the active region 15 and the lateral line Hd which is aligned with the bottom surface of the trench TR2 may range from 40 to 64 nm.

When the active region 15 includes an N-type impurity, the source/drain region 50 may include a first epitaxial layer 51, a second epitaxial layer 53, and a third epitaxial layer 55. In an example embodiment, a Ge content of the first epitaxial layer 51 may range from 25 to 35 atom %. A Ge content of the second epitaxial layer 53 may range from 50 to 70 atom %. A Ge content of the third epitaxial layer 55 may range from 0 to 10 atom %. The third epitaxial layer 55 may be omitted.

When the active region 15 includes a P-type impurity, the source/drain region 50 may include single crystalline silicon (Si) doped with phosphorus (P) or single crystalline silicon (Si) doped with carbon (C) which is formed by an SEG method. For example, a phosphorus (P) doping concentration of the source/drain region 50 may range from 5 to 10 atom %. Alternatively, a carbon (C) doping concentration of the source/drain region 50 may range from 0.5 to 2 atom %.

Figure 8:
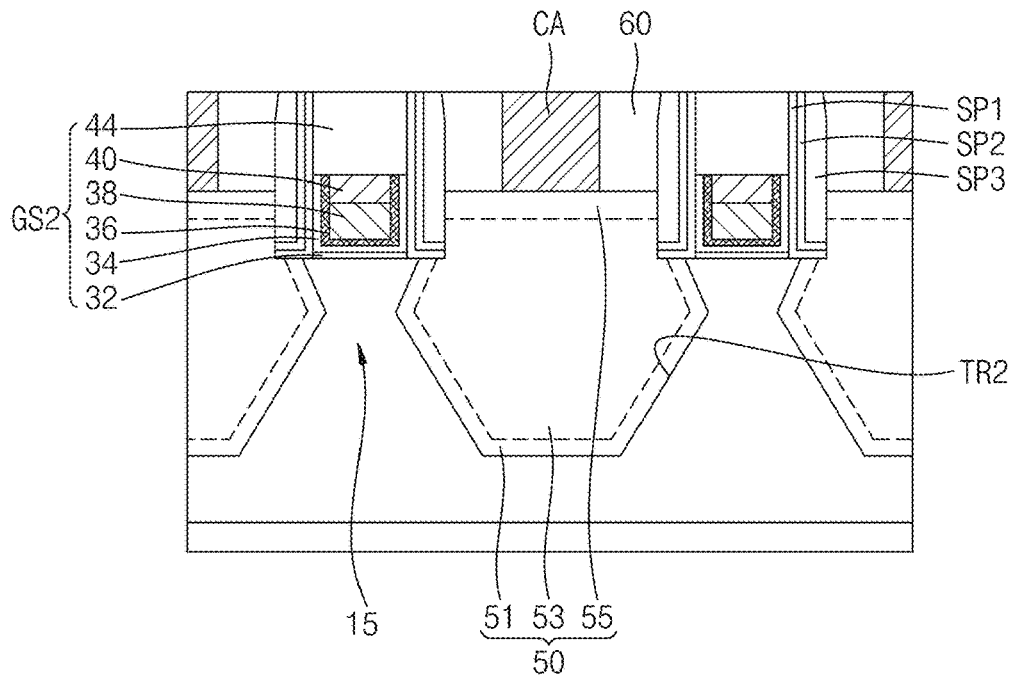
FIG. 8 is a cross-sectional view of a semiconductor device according to some example embodiments.
Figure 9:
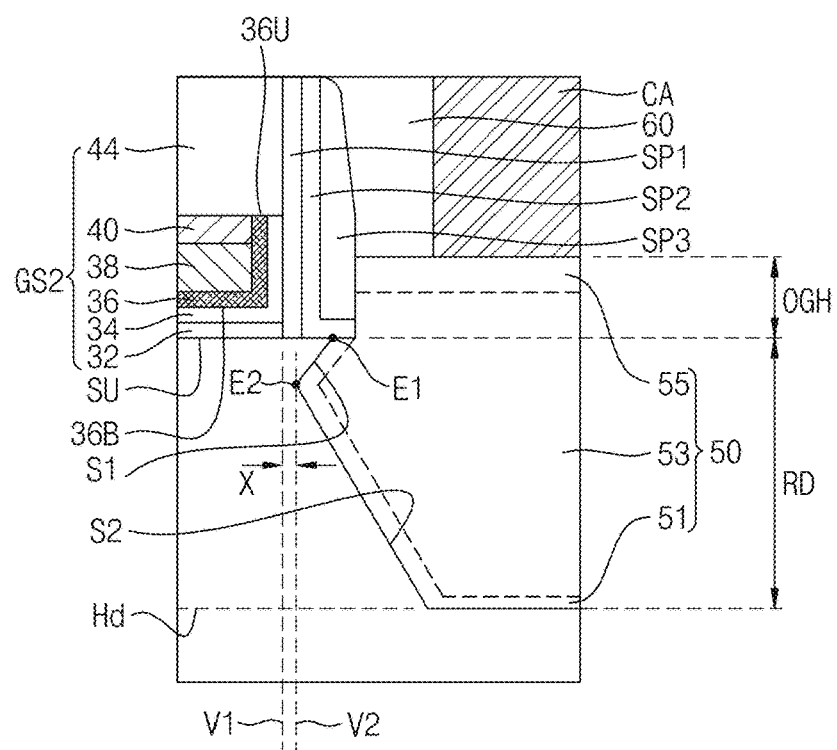
FIG. 9 is an enlarged cross-sectional view showing a region of FIG. 8.

FIG. 8 is a cross-sectional view of a semiconductor device according to some example embodiments. FIG. 9 is an enlarged cross-sectional view showing a region of FIG. 8. In FIGS. 2 to 9, like reference numerals denote like elements. Hereinafter, substantially the same contents as those described in FIGS. 2 to 7 will be omitted and differences therebetween will be described.

Referring to FIGS. 8 and 9, a trench TR2 may have a side surface having a sigma (Σ) shaped profile or a notch shaped profile when viewed along the direction in FIG. 8. Accordingly, due to the trench TR2, the active region 15 may have a sigma (Σ) shaped profile. A gate insulating layer 34 and a ferroelectric layer 36 may have a U-shaped cross section when viewed along the direction in FIG. 8. The U-shape cross section may include right angles. An upper surface of a source/drain region 50 may be located at a level between a bottom surface 36B and an upper end 36U of the ferroelectric layer 36.

FIGS. 10 to 18 are cross-sectional views for describing a method of manufacturing semiconductor devices according to some example embodiments.

Figure 10:
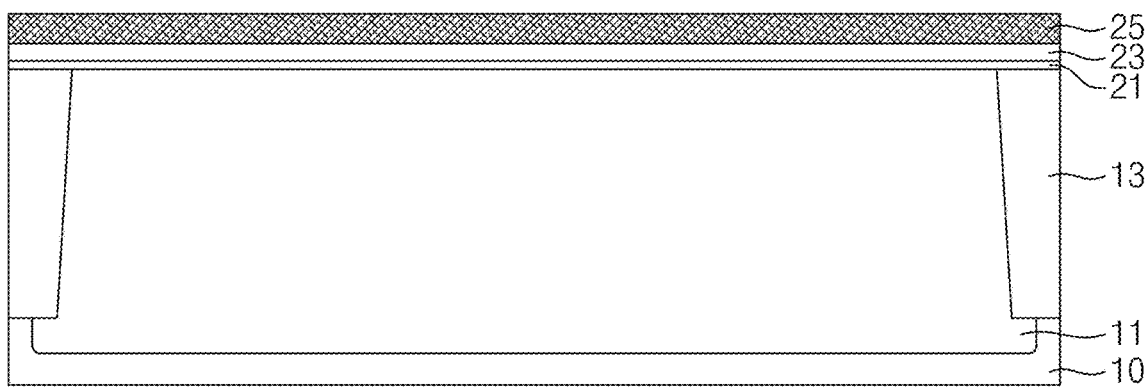
FIGS. 10 to 18 are cross-sectional views for describing a method of manufacturing semiconductor devices according to some example embodiments.

Referring to FIG. 10, a substrate 10 including an active region 15 may be provided. A device isolation layer 13 may be formed on the substrate 10 to define the active region 15. The device isolation layer 13 may include a shallow trench isolation (STI) structure. The device isolation layer 13 may include at least one of silicon oxide, silicon nitride, and silicon oxynitride.

Impurities may be implanted into the active region 15 to form a well region 11. N-type impurities may be implanted into the active region 15 to form an n-well, or P-type impurities may be implanted into the active region 15 to form a p-well. Hereinafter, description will be made assuming that a substrate may include P-type impurities and a well region includes N-type impurities.

A spare interface layer 21 may be formed on the substrate 10. For example, the spare interface layer 21 may include silicon oxide. The spare interface layer 21 may be formed by a deposition process or an oxidation process.

A spare gate insulating layer 23 may be formed on the spare interface layer 21. For example, the spare gate insulating layer 23 may include silicon oxide, silicon nitride, silicon oxynitride, germanium oxynitride, germanium silicon oxide, a high-k dielectric material, a combination thereof, or a stacked film in which the above materials are sequentially stacked.

A spare ferroelectric layer 25 may be formed on the spare gate insulating layer 23. The spare ferroelectric layer 25 may include hafnium oxide ($HfO_x$). The spare ferroelectric layer 25 may further include a metallic element impurity. In an example embodiment, the spare ferroelectric layer 25 may be doped with an impurity and annealed. At least a portion of the spare ferroelectric layer 25 may be converted from an amorphous phase into a crystalline (orthorhombic) phase by the impurity doping and/or annealing. For example, the spare ferroelectric layer 25 may be doped with 3 to 8 mol % of aluminum (Al) and annealed in a range from 800 to 1,000° C. The spare ferroelectric layer 25 may be doped with 2 to 10 mol % of silicon (Si) and annealed in a range from 650 to 1,000° C. The spare ferroelectric layer 25 may be doped with 2 to 10 mol % of iridium (Y) and annealed in a range from 600 to 1,000° C. The spare ferroelectric layer 25 may be doped with 1 to 7 mol % of gadolinium (Gd) and annealed in a range from 450 to 800° C. However, the inventive concepts are not limited thereto, and the impurity doping and/or annealing processes may be omitted.

Figure 11:
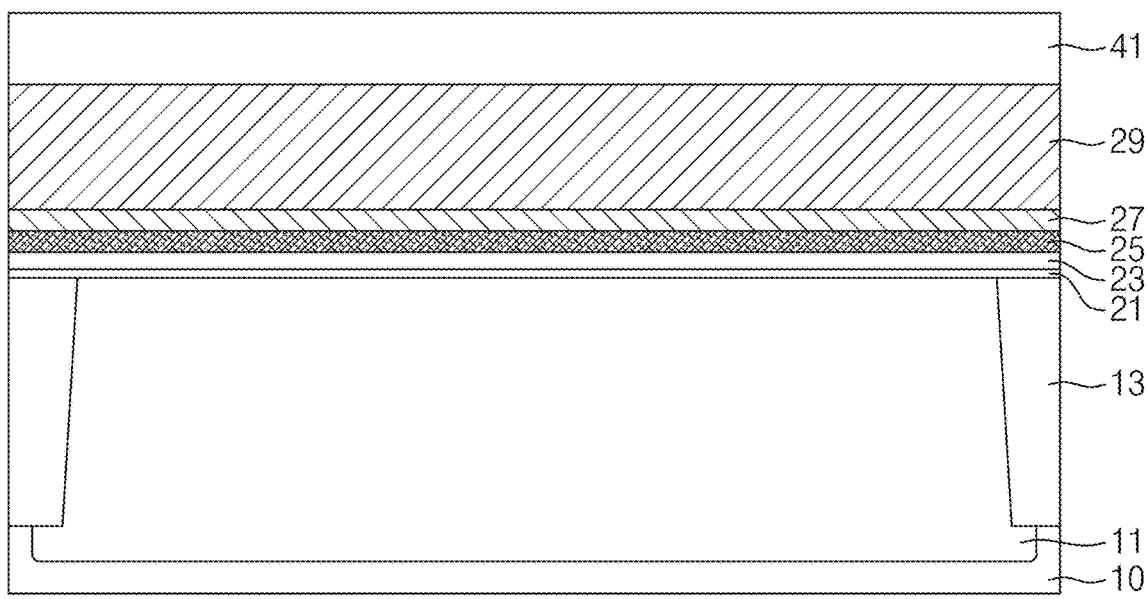

Referring to FIG. 11, a spare barrier layer 27 may be formed on the spare ferroelectric layer 25. For example, the spare barrier layer 27 may include TiN. The spare barrier layer 27 may be formed by an atomic layer deposition (ALD) process, a physical vapor deposition (PVD) process, or a chemical vapor deposition (CVD) process. The spare barrier layer 27 may be formed and then an annealing process may be further performed thereon.

A spare gate electrode layer 29 may be formed on the spare barrier layer 27. The spare gate electrode layer 29 may include at least one of polysilicon, polysilicon germanium, doped polysilicon, Ta, TaN, TaSiN, TiN, Mo, Ru, Ni, and NiSi.

A spare gate capping layer 41 may be formed on the spare gate electrode layer 29. For example, the spare gate capping layer 41 may include at least one of silicon nitride and silicon oxynitride.

Figure 12:
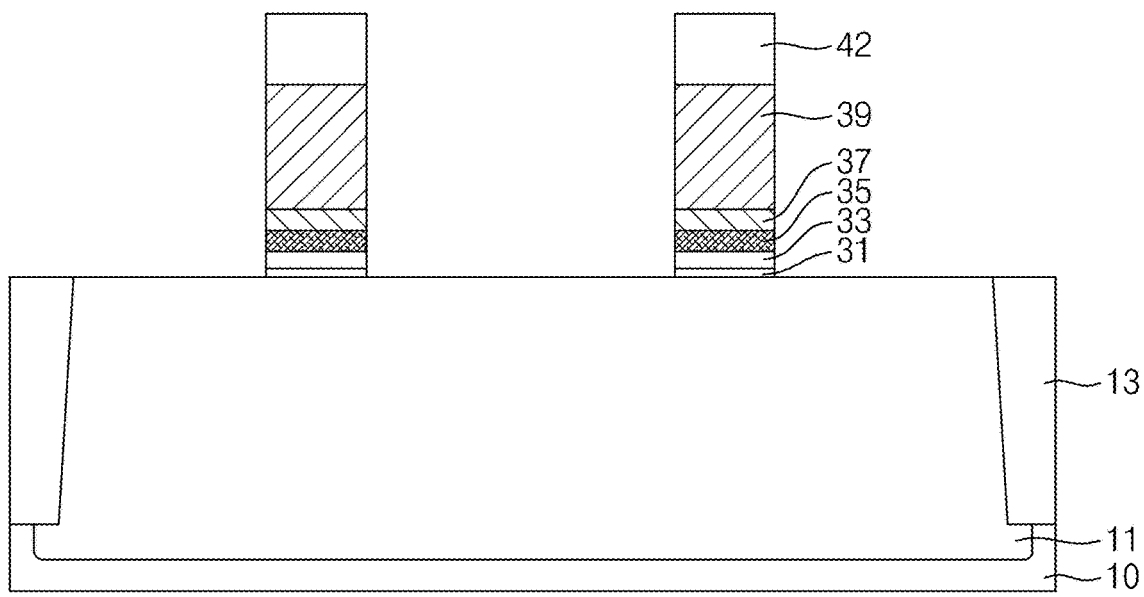

Referring to FIG. 12, the spare interface layer 21, the spare gate insulating layer 23, the spare ferroelectric layer 25, the spare barrier layer 27, the spare gate electrode layer 29, and the spare gate capping layer 41 may be patterned to form a plurality of gate structure patterns. The gate structure pattern may include an interface layer 31, a gate insulating layer 33, a ferroelectric layer 35, a barrier layer 37, a gate electrode layer 39, and a gate capping layer 42 which are stacked on the active region 15 of the substrate 10. The gate structure patterns may be formed on the substrate 10 to extend in a direction crossing the active region 15.

Figure 13:
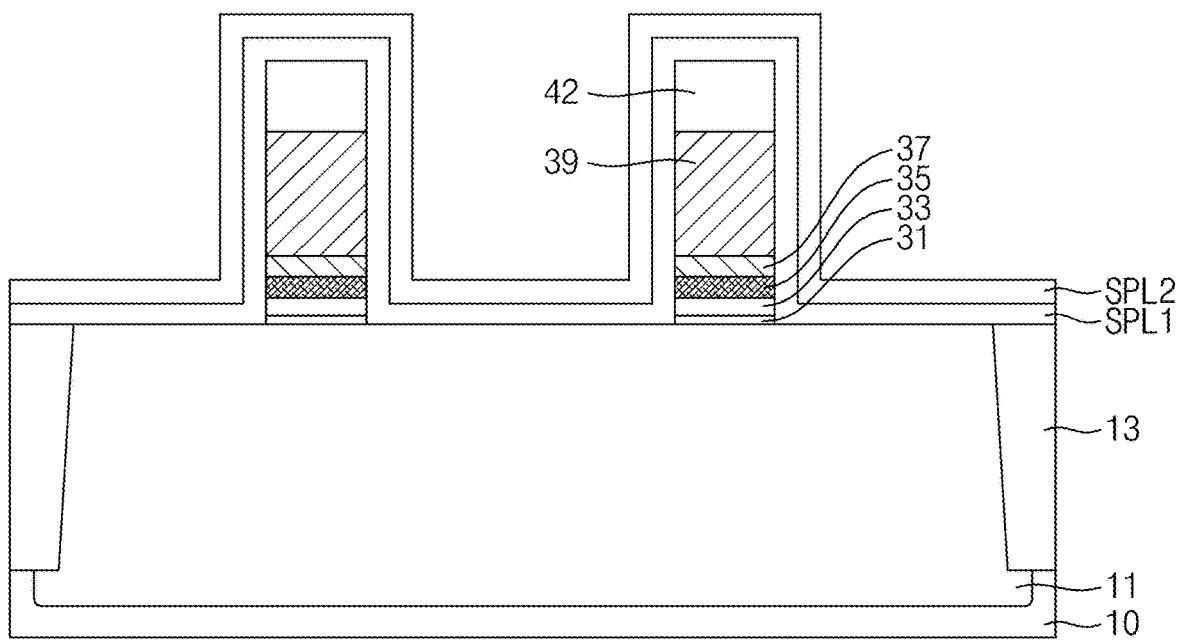

Referring to FIG. 13, spare spacer layers SPL1 and SPL2 may be formed on the substrate 10. The spare spacer layers SPL1 and SPL2 may conformally cover an upper surface of the substrate 10, upper surfaces and side surfaces of the gate structure patterns, and an upper surface of the device isolation layer 13. The spare spacer layers SPL1 and SPL2 may be formed as a single layer or a multi-layer.

Figure 14:
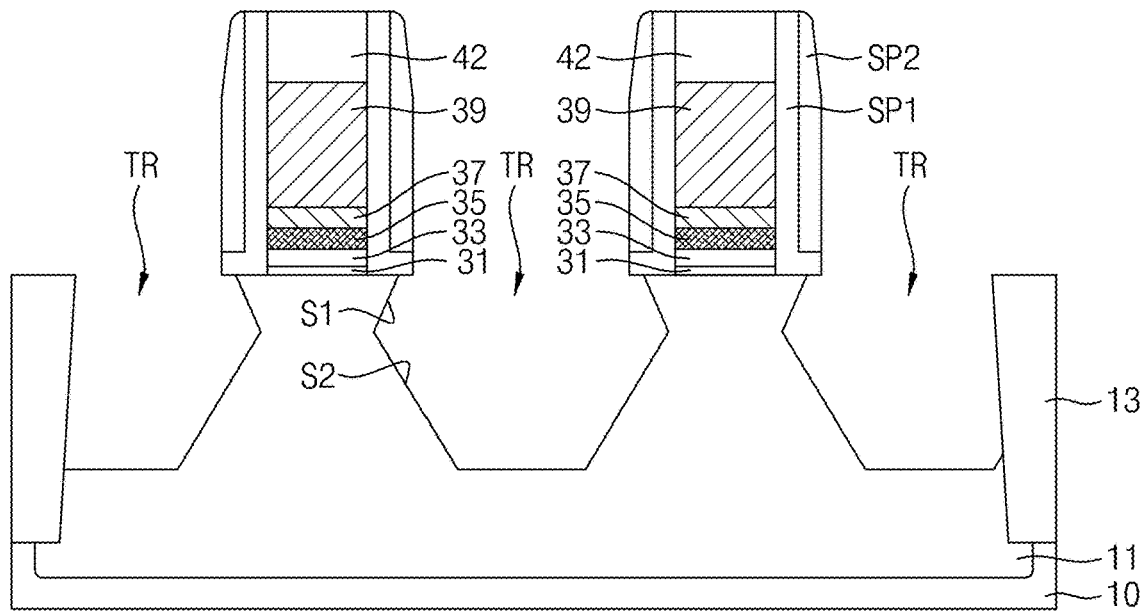

Referring to FIG. 14, the upper surface of the substrate 10 and the upper surface of the device isolation layer 13 may be exposed by the spare spacer layers SPL1 and SPL2 being partially etched so that gate spacers SP1 and SP2 may be formed. The spare spacer layers SPL1 and SPL2 may be partially removed so that a plurality of gate structures including the interface layer 31, the gate insulating layer 33, the ferroelectric layer 35, the barrier layer 37, the gate electrode layer 39, the gate capping layer 42, and the gate spacers SP1 and SP2 may be formed.

The active region 15 may be etched using the exposed upper surface of the substrate 10 so that a trench TR may be formed. For example, the trench TR may be formed between the gate structures. The trench TR may be formed by an isotropic etching process, a directional etching process, an anisotropic etching process, or a combination thereof. The trenches TR may be uniformly formed on the entire surface of the substrate. For example, the trench TR may be formed by sequentially performing an isotropic etching process and a directional etching process. A wet etching process using $NH_4OH$, $NH_3OH$, tetra methyl ammonium hydroxide (TMAH), KOH, NaOH, benzyltrimethylammonium hydroxide (BTMH), or a combination thereof may be applied as the isotropic etching process. In the directional etching process, HBr, $CF_4$, $O_2$, $Cl_2$, $NF_3$, or a combination thereof may be used.

The active region 15 and the device isolation layer 13 may be exposed by the trench TR. The active region 15 may have a first side surface Si, a second side surface S2, and a bottom surface due to the trench TR. The active region 15 may have a sigma (Σ) shaped profile or a notch shaped profile due to the first side surface S1 and the second side surface S2 when viewed along the direction in FIG. 14.

Figure 15:
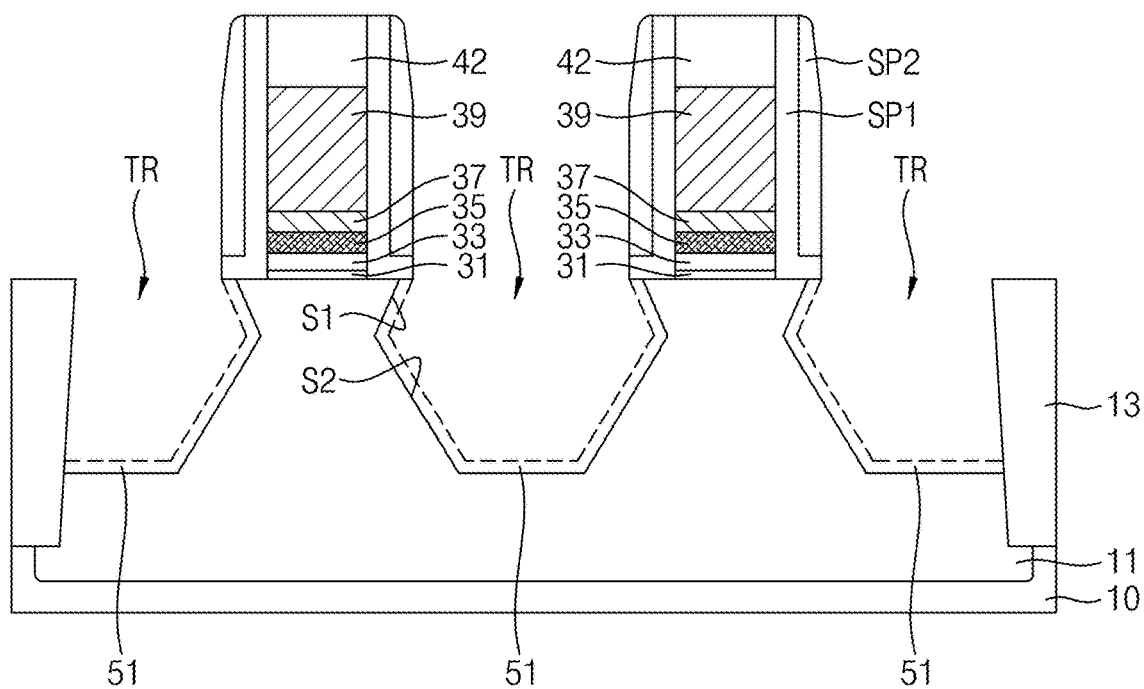

Referring to FIG. 15, a first epitaxial layer 51 may be formed in the trench TR. The first epitaxial layer 51 may conformally cover the first side surface S1, the second side surface S2, and the bottom surface of the trench TR. The first epitaxial layer 51 may include undoped single crystalline SiGe formed by an SEG method. A Ge content of the first epitaxial layer 51 may range from 25 to 35 atom %.

Figure 16:
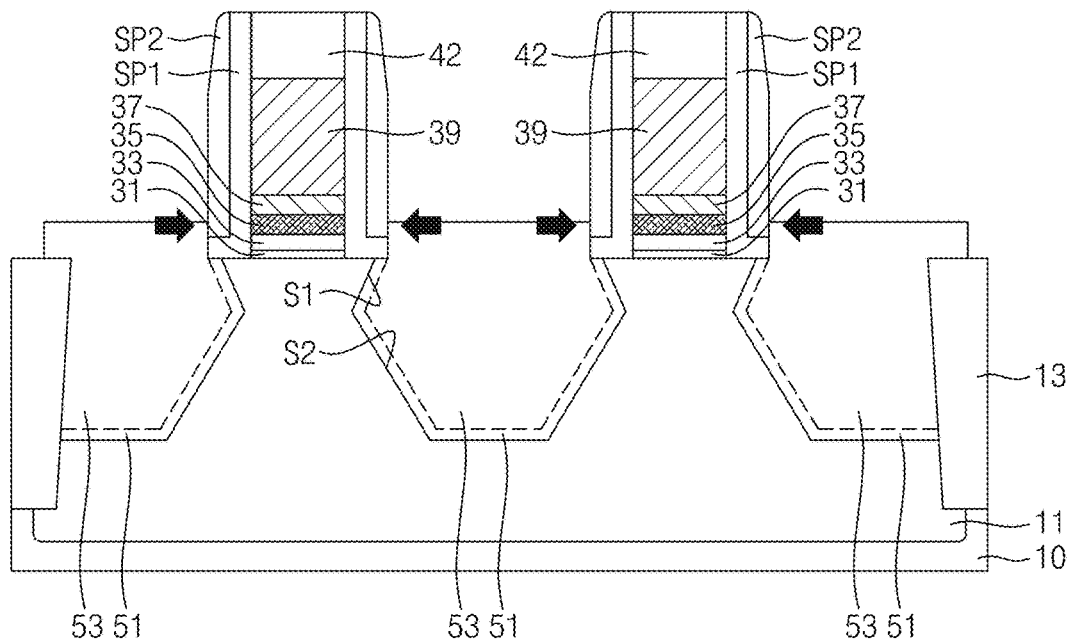

Referring to FIG. 16, in the trench TR, a second epitaxial layer 53 may be formed on the first epitaxial layer 51. The second epitaxial layer 53 may include single crystalline SiGe doped with boron (B) formed by an SEG method. A Ge content of the second epitaxial layer 53 may be higher than that of the first epitaxial layer 51. In an example embodiment, the Ge content of the second epitaxial layer 53 may range from 50 to 70 atom %. The second epitaxial layer 53 may fully fill the trench TR. An upper surface of the second epitaxial layer 53 may be located at a higher level than the upper surface of the active region 15. The second epitaxial layer 53 may be in contact with outer sidewalls of the gate spacers SP1 and SP2. The second epitaxial layer 53 may be grown to the same level as an upper surface of the ferroelectric layer 35. In an example embodiment, the upper surface of the second epitaxial layer 53 may be located at a level equal to or higher than the upper surface of the ferroelectric layer 35. The second epitaxial layer 53 may apply a strain at both sides of the ferroelectric layer 35.

Figure 17:
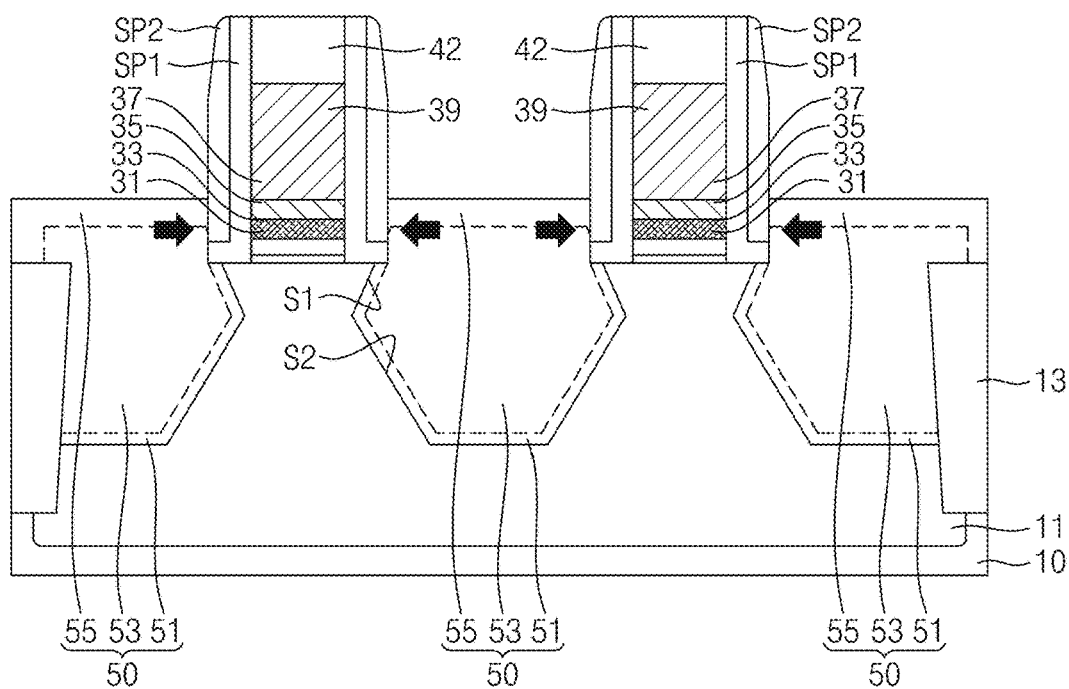

Referring to FIG. 17, a third epitaxial layer 55 may be formed on the second epitaxial layer 53. The third epitaxial layer 55 may include single crystalline S1 doped with boron (B) or single crystalline SiGe doped with boron (B) which is formed by an SEG method. A Ge content of the third epitaxial layer 55 may be lower than that of the second epitaxial layer 53.

The first epitaxial layer 51, the second epitaxial layer 53, and the third epitaxial layer 55 may constitute an embedded stressor (i.e., a source/drain region). In one example embodiment, the embedded stressor including the first epitaxial layer 51 and the second epitaxial layer 53 may apply a strain ranging from 1 to 4.5 Gpa to the ferroelectric layer 35. In another example embodiment, the embedded stressor may apply a strain ranging from 2 to 4.5 Gpa to the ferroelectric layer 35. When the strain is applied to the ferroelectric layer 35, the ferroelectric layer 35 may be converted from an amorphous phase into a crystalline phase so that 20% or more of the ferroelectric layer 35 includes orthorhombic crystals.

Figure 18:
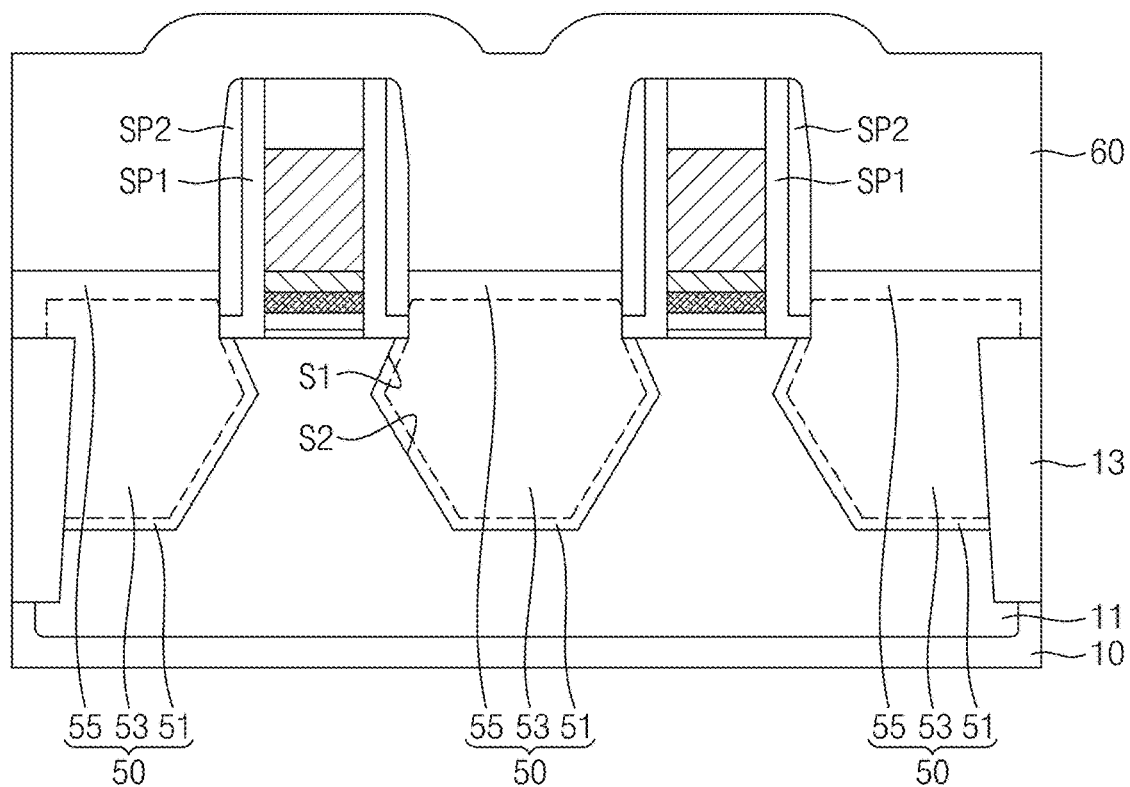

Referring to FIG. 18, an interlayer insulating layer 60 may be formed on the substrate 10. The interlayer insulating layer 60 may include silicon oxide, silicon nitride, silicon oxynitride, or a combination thereof. Although not shown in the drawing, a metal silicide formation process, an annealing process, and the like may be performed on the third epitaxial layer 55 before the interlayer insulating layer 60 is formed, and descriptions thereof will be omitted. The interlayer insulating layer 60 may be formed and then a chemical-mechanical polishing (CMP) process may be performed thereon.

FIGS. 19 to 27 are cross-sectional views for describing a method of manufacturing semiconductor devices according to some example embodiments.

Figure 19:
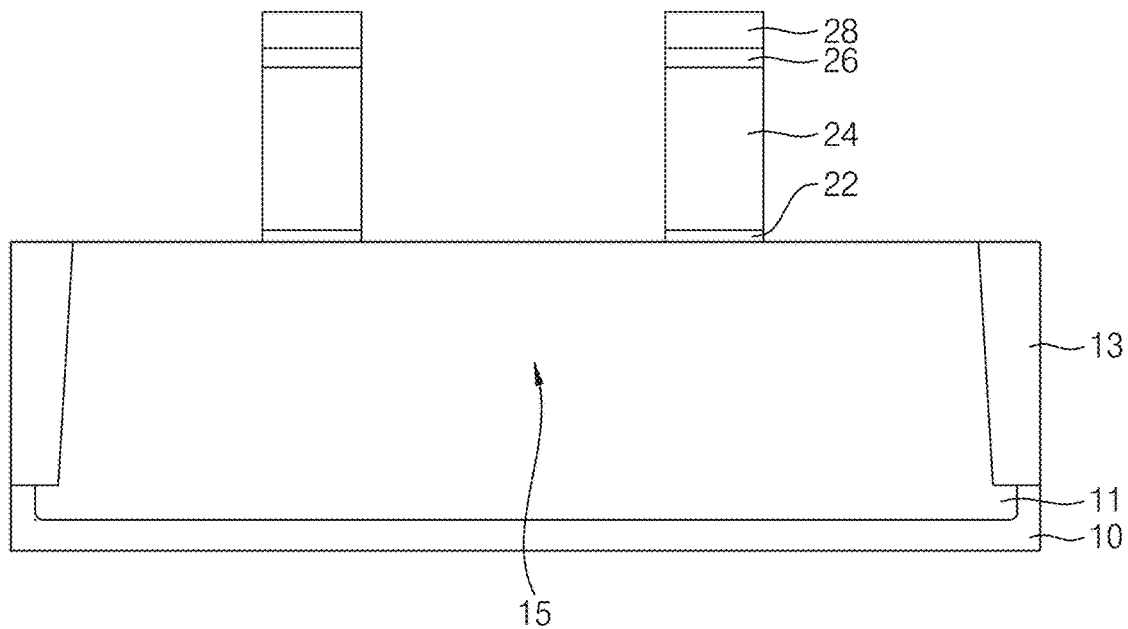
FIGS. 19 to 27 are cross-sectional views for describing a method of manufacturing semiconductor devices according to some example embodiments.

Referring to FIG. 19, a well region 11, an active region 15, a device isolation layer 13, a sacrificial gate insulating layer 22, a sacrificial gate electrode layer 24, a first mask pattern 26, and a second mask pattern 28 may be formed on a substrate 10.

The sacrificial gate insulating layer 22 may be formed on the substrate 10. The sacrificial gate insulating layer 22 may be formed to cross the active region 15. The sacrificial gate insulating layer 22 may also cross the device isolation layer 13. The sacrificial gate insulating layer 22 may include silicon oxide, silicon nitride, silicon oxynitride, or a combination thereof.

The sacrificial gate electrode layer 24 may be formed on the sacrificial gate insulating layer 22. For example, the sacrificial gate electrode layer 24 may include polysilicon.

The first mask pattern 26 may be formed on the sacrificial gate electrode layer 24. The first mask pattern 26 may include a material having an etch selectivity with respect to the sacrificial gate electrode layer 24. The second mask pattern 28 may be formed on the first mask pattern 26. The second mask pattern 28 may include a material having an etch selectivity with respect to the first mask pattern 26. For example, the first mask pattern 26 may include silicon oxide and the second mask pattern 28 may include silicon nitride or polysilicon. Either of the first mask pattern 26 or the second mask pattern 28 may be omitted.

The sacrificial gate insulating layer 22, the sacrificial gate electrode layer 24, the first mask pattern 26, and the second mask pattern 28 may be sequentially stacked on the substrate 10. Side surfaces of the sacrificial gate insulating layer 22, the sacrificial gate electrode layer 24, the first mask pattern 26, and the second mask pattern 28 may be vertically aligned with each other. The sacrificial gate insulating layer 22, the sacrificial gate electrode layer 24, the first mask pattern 26, and the second mask pattern 28 may be referred to as a sacrificial gate pattern. The sacrificial gate pattern may cross the active region 15. A plurality of sacrificial gate patterns may be formed in parallel to be spaced apart from each other.

Figure 20:
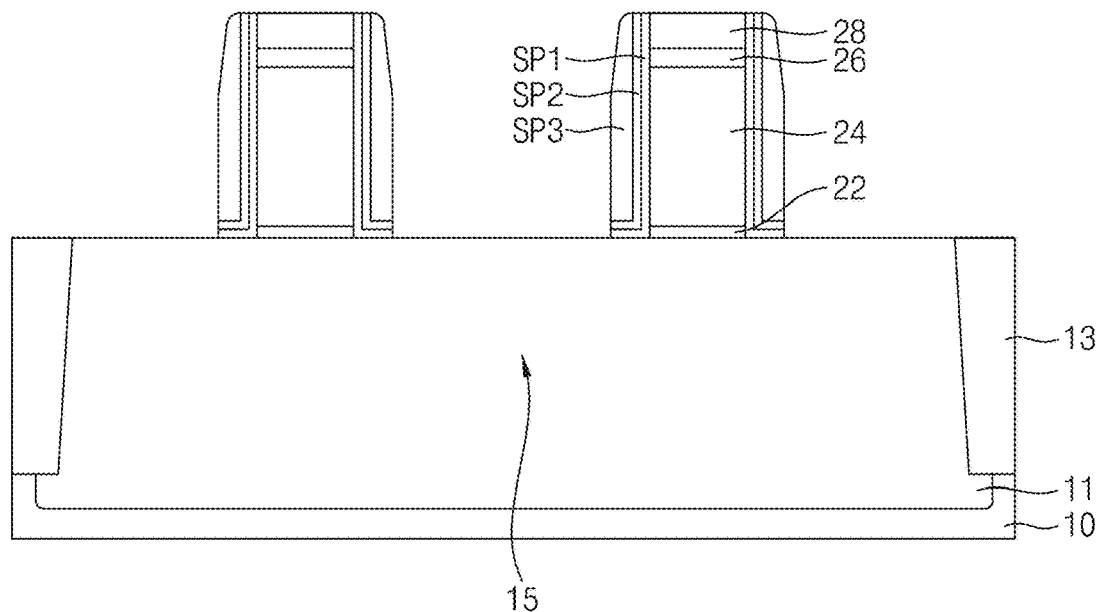

Referring to FIG. 20, a first gate spacer SP1, a second gate spacer SP2, and a third gate spacer SP3 may be formed to cover sidewalls of the sacrificial gate patterns. The first gate spacer SP1, the second gate spacer SP2, and the third gate spacer SP3 may be formed by a plurality of thin film formation processes and a plurality of anisotropic etching processes. Each of the first gate spacer SP1, the second gate spacer SP2, and the third gate spacer SP3 may include silicon oxide, silicon nitride, silicon oxynitride, or a combination thereof.

Figure 21:
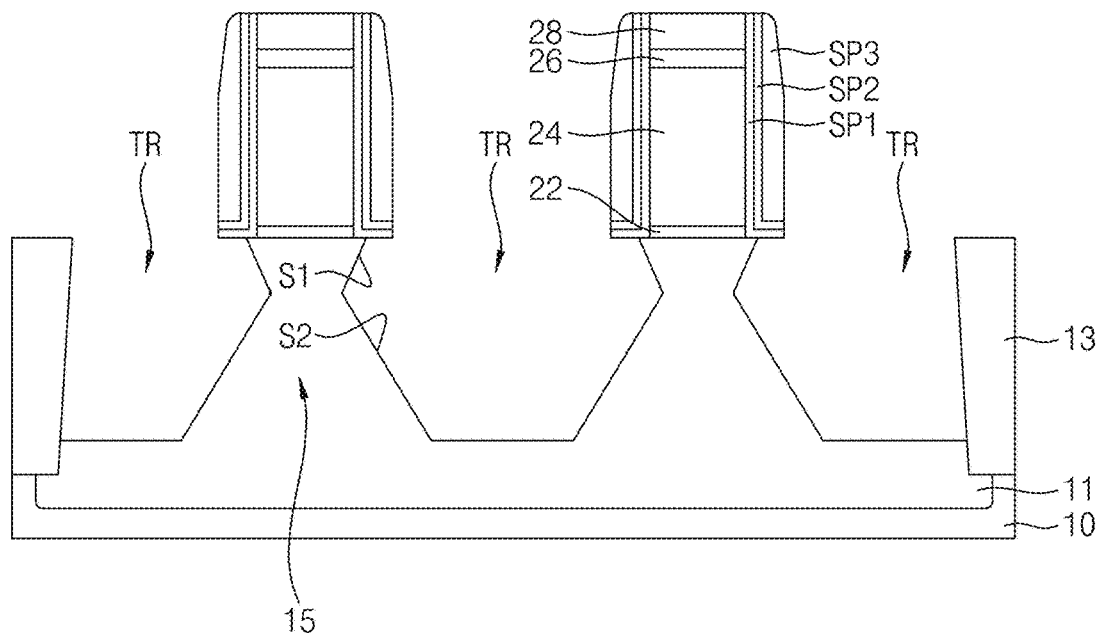

Referring to FIG. 21, the active region 15 may be etched by an exposed upper surface of the substrate 10 so that a trench TR may be formed. The trench TR may be formed in the same manner as or a similar manner to that described in FIG. 9.

Figure 22:
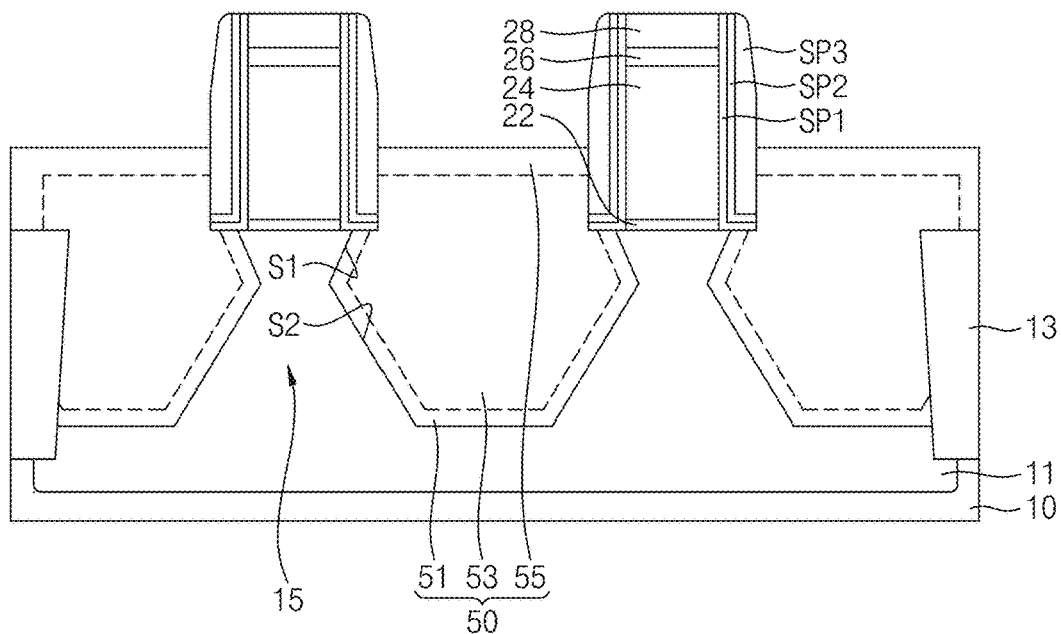

Referring to FIG. 22, a first epitaxial layer 51 may be formed in the trench TR. The first epitaxial layer 51 may be formed to conformally cover an inner wall of the trench TR. The first epitaxial layer 51 may cover a first side surface 51, a second side surface S2, and a bottom surface of the trench TR. The first epitaxial layer 51 may include undoped single crystalline SiGe formed by an SEG method. In an example embodiment, a Ge content of the first epitaxial layer 51 may range from 25 to 35 atom %.

In the trench TR, a second epitaxial layer 53 may be formed on the first epitaxial layer 51. The second epitaxial layer 53 may fully fill the trench TR. An upper surface of the second epitaxial layer 53 may be located at a higher level than an upper surface of the active region 15. The second epitaxial layer 53 may be in contact with outer side surfaces of the first to third gate spacers SP1, SP2, and SP3. The second epitaxial layer 53 may include single crystalline SiGe doped with boron (B) formed by an SEG method. A Ge content of the second epitaxial layer 53 may be higher than that of the first epitaxial layer 51. In an example embodiment, the Ge content of the second epitaxial layer 53 may range from 50 to 70 atom %.

A third epitaxial layer 55 may be formed on the second epitaxial layer 53. The third epitaxial layer 55 may include single crystalline S1 doped with boron (B) or single crystalline SiGe doped with boron (B) which is formed by an SEG method. A Ge content of the third epitaxial layer 55 may be lower than that of the second epitaxial layer 53.

The first epitaxial layer 51, the second epitaxial layer 53, and the third epitaxial layer 55 may constitute a source/drain region 50. The source/drain region 50 may be referred to as an embedded stressor.

Figure 23:
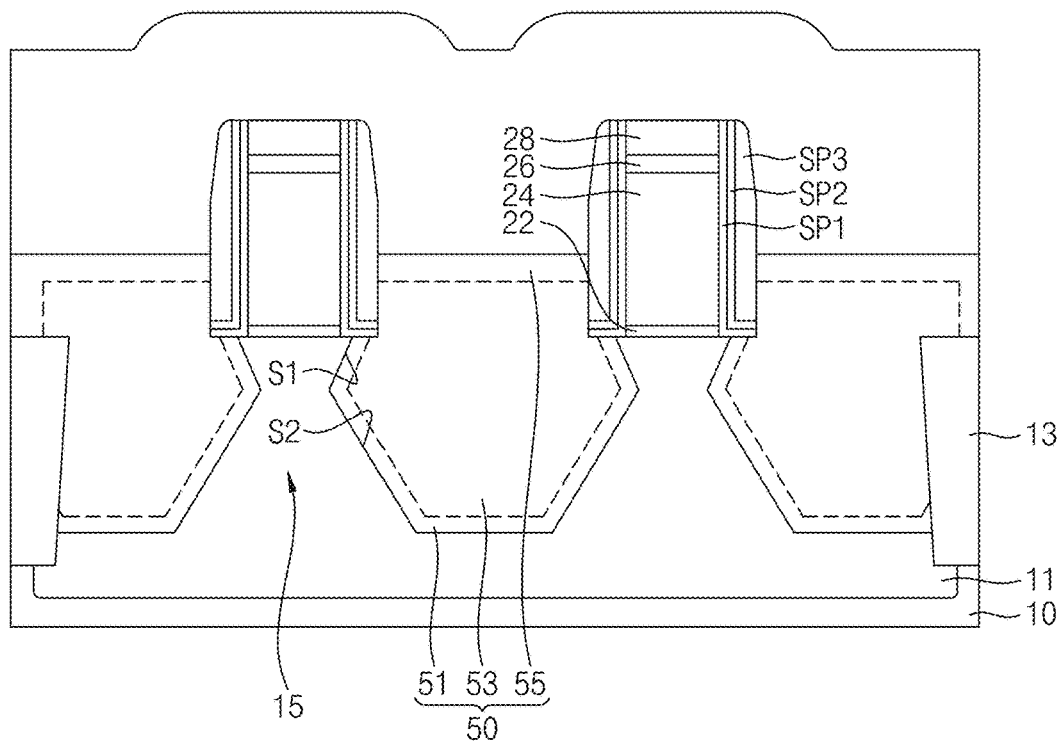

Referring to FIG. 23, an interlayer insulating layer 60 may be formed on the substrate 10. Although the interlayer insulating layer 60 is not shown in the drawing, a metal silicide formation process, an annealing process, and the like may be performed on the third epitaxial layer 55 before the interlayer insulating layer 60 is formed, and descriptions thereof will be omitted.

Figure 24:
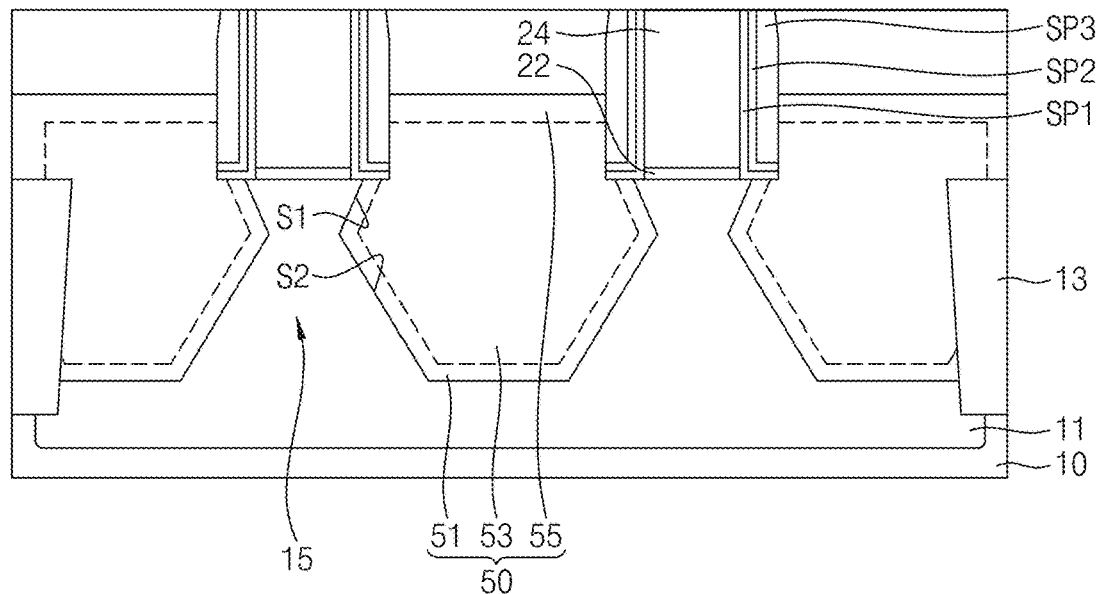

Referring to FIG. 24, the interlayer insulating layer 60 may be partially removed and the second mask pattern 28 and the first mask pattern 26 may be removed so that the sacrificial gate electrode layer 24 may be exposed. A portion of the interlayer insulating layer 60, the second mask pattern 28, and the first mask pattern 26 may be removed by performing a CMP process, an etch-back process, or a combination thereof. The interlayer insulating layer 60 may remain on the third epitaxial layer 55.

Figure 25:
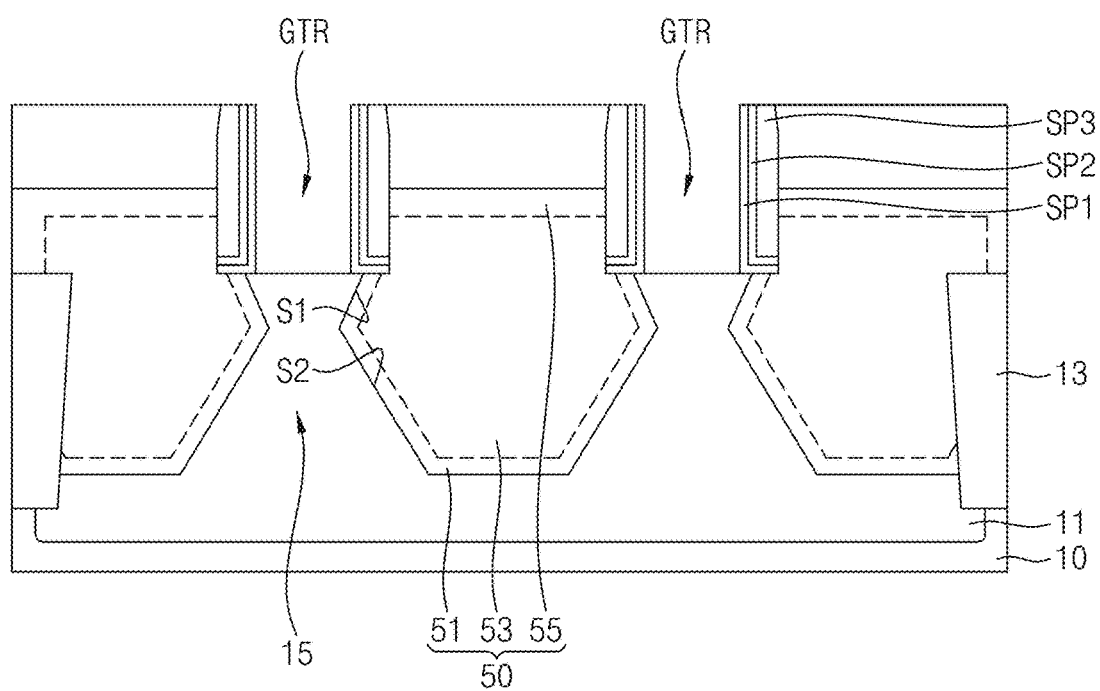

Referring to FIG. 25, the sacrificial gate electrode layer 24 and the sacrificial gate insulating layer 22 may be removed so that a gate trench GTR, by which the active region 15 is exposed, may be formed.

Figure 26:
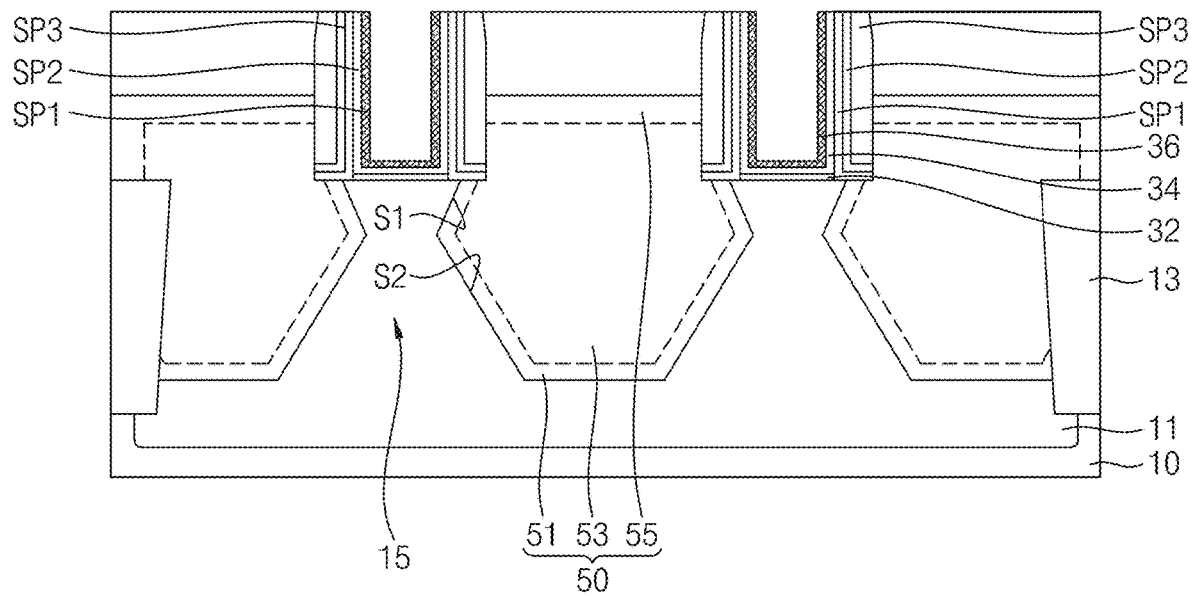

Referring to FIG. 26, an interface layer 32, a gate insulating layer 34, and a ferroelectric layer 36 may be formed in the gate trench GTR.

The interface layer 32 may be formed on the active region 15. For example, the interface layer 32 may include silicon oxide. For example, the interface layer 32 may be formed by a deposition process or an oxidation process. The interface layer 32 may be formed by an SEG method. The interface layer 32 may include, for example, silicon carbide (SiC) or silicon germanium (SiGe). A thickness of the interface layer 32 may be less than or equal to a critical thickness. For example, the thickness of the interface layer 32 may range from 0.1 to 2.5 nm. The interface layer 32 having a thickness less than or equal to the critical thickness formed on the substrate 10 may be fully strained. That is, a lattice constant of the interface layer 32 may be the same as a lattice constant of the substrate 10.

The gate insulating layer 34 may be formed on the interface layer 32. The gate insulating layer 34 may be in contact with the interface layer 32 and the first gate spacer SP1. The gate insulating layer 34 may extend along an upper surface of the interface layer 32 and an inner sidewall of the first gate spacer SP1. The gate insulating layer 34 may surround a lower surface and an outer sidewall of the ferroelectric layer 36. For example, the gate insulating layer 34 may include silicon oxide, silicon nitride, silicon oxynitride, germanium oxynitride, germanium silicon oxide, a high-k dielectric material, a combination thereof, or a stacked film in which the above materials are sequentially stacked.

The ferroelectric layer 36 may be formed on the gate insulating layer 34. The ferroelectric layer 36 may include hafnium oxide ($HfO_x$). The ferroelectric layer 36 may further include a metallic element impurity. In an example embodiment, the ferroelectric layer 36 may be doped with an impurity and annealed. At least a portion of the ferroelectric layer 36 may be converted from an amorphous phase into a crystalline (orthorhombic) phase by the impurity doping and/or annealing. For example, the ferroelectric layer 36 may be doped with 3 to 8 mol % of aluminum (Al) and annealed in a range from 800 to 1,000° C. The ferroelectric layer 36 may be doped with 2 to 10 mol % of silicon (Si) and annealed in a range from 650 to 1,000° C. The ferroelectric layer 36 may be doped with 2 to 10 mol % of iridium (Y) and annealed in a range from 600 to 1,000° C. The ferroelectric layer 36 may be doped with 1 to 7 mol % of gadolinium (Gd) and annealed in a range from 450 to 800° C. However, the inventive concepts are not limited thereto, and the impurity doping and/or annealing processes may be omitted. In addition, the ferroelectric layer 36 may be converted from an amorphous phase into a crystalline (orthorhombic) phase by a strain being applied during the process of forming the gate insulating layer 34. The interface layer 32 may be fully strained due to the source/drain region 50 and thus a strain may be applied to the ferroelectric layer 36 formed on the interface layer 32 and the crystalline phase may be changed.

Figure 27:
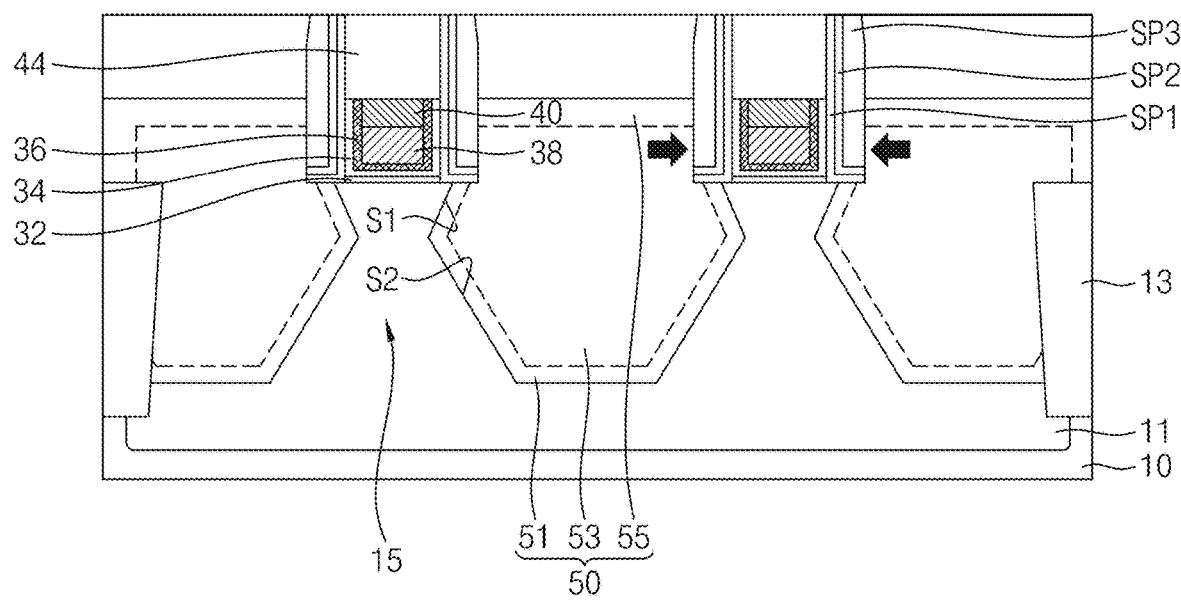

Referring to FIG. 27, a first gate electrode layer 38 and a second gate electrode layer 40 may be formed on the ferroelectric layer 36. For example, the first gate electrode layer 38 may include TiN, TaN, TiAl, or TiAlC. The second gate electrode layer 40 may include a metal such as W. The gate insulating layer 34, the ferroelectric layer 36, and the second gate electrode layer 40 may be partially removed and a gate capping layer 44 may be formed.

Figure 28:
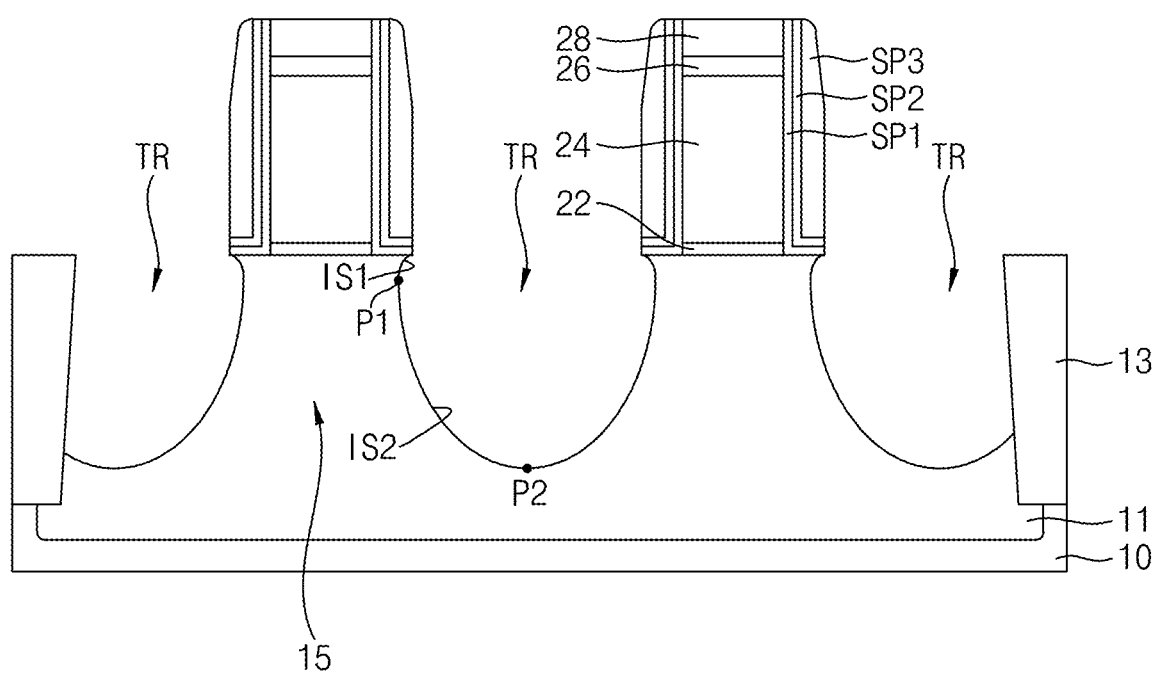
FIG. 28 is a cross section for describing a method of manufacturing semiconductor devices according to some example embodiments.

FIG. 28 is a cross section for describing a method of manufacturing semiconductor devices according to some example embodiments. FIG. 28 shows a method of forming the trench shown in FIGS. 2 to 4B. FIG. 28 shows a gate-last process according to an example embodiment, and the method of forming the trench, which is described in FIG. 28, may also be applied to a gate-first process.

Referring to FIG. 28, an active region 15 may be etched so that trenches TR may be formed. The trenches TR may be formed by an anisotropic etching process. For example, an anisotropic etching process in which a mask pattern 28 and spacers SP1, SP2, and SP3 are used as etch masks and HBr, $CF_4$, $O_2$, $Cl_2$, $NF_3$, or a combination thereof are used may be applied as the above anisotropic etching process. Each of the trenches TR may have a U shape when viewed along the direction in FIG. 28. For example, the trench TR may include a portion P1 which protrudes most in a direction of the active region 15 and may include an upper inner wall IS1 formed on the most protruding portion P1 and a lower inner wall IS2 which connects the most protruding portion P1 to a lower end P2 of the trench TR. Alternatively, sidewalls of the trenches TR may have a profile that is substantially perpendicular to a surface of a substrate 10.

According to the example embodiments of the inventive concepts, a negative capacitor transistor having improved performance and stability can be provided by using a ferroelectric having a relatively small thickness and a large residual polarization magnitude.

While the embodiments of the inventive concepts have been described with reference to the accompanying drawings, it should be understood by those skilled in the art that various modifications may be made without departing from the scope of the inventive concepts and without changing essential features thereof. Therefore, the above-described embodiments should be considered in a descriptive sense only and not for purposes of limitation.

What is claimed is:

1. A ferroelectric semiconductor device comprising:
   an active region on a substrate;
   a gate insulating layer on the active region;
   a ferroelectric layer on the gate insulating layer and including an oxide;
   a gate electrode layer on the ferroelectric layer;

a gate spacer covering both side surfaces of the gate insulating layer, the ferroelectric layer, and the gate electrode layer; and
source/drain regions on the active region, adjacent to both sides of the gate spacer,
the oxide being hafnium oxide ($HfO_2$) or $Hf_aZr_{1-a}O_b$ ([a]=0.2 to 0.8 and [b]=2 to 4), the hafnium oxide ($HfO_2$) being doped with at least one of 3 to 8 mol % of aluminum (Al), 2 to 10 mol % of silicon (Si), 2 to 10 mol % of iridium (Y), 1 to 7 mol % of lanthanum (La), and 1 to 7 mol % of gadolinium (Gd),
the ferroelectric layer including 20% or more of orthorhombic crystals, and
an upper surface of the source/drain region is located at a level substantially equal to or higher than that of an upper surface of the ferroelectric layer.

2. The ferroelectric semiconductor device of claim 1, wherein
a lateral distance between a vertical line perpendicular to an upper surface of the active region and aligned with an inner sidewall of the gate spacer, and a portion of the source/drain regions ranges from −3 to +5 nm, the portion of the source/drain regions being a portion protruding most in an inward direction of the gate insulating layer, when the lateral distance is negative, the portion of the source/drain regions vertically overlap a portion of the gate electrode layer,
a vertical height of the upper surface of the source/drain region from an upper end of the active region ranges from 1 to 25 nm, and
a vertical depth of a lower end of the source/drain region from the upper end of the active region ranges from 40 to 65 nm.

3. The ferroelectric semiconductor device of claim 1, wherein the source/drain region includes silicon germanium (SiGe),
wherein the silicon germanium (SiGe) includes
a first epitaxial layer having a germanium (Ge) content of 25 to 35 atom %; and
a second epitaxial layer on the first epitaxial layer and having a germanium (Ge) content of 50 to 70 atom %.

4. The ferroelectric semiconductor device of claim 1, wherein the source/drain region includes silicon (Si) doped with 5 to 10 atom % of phosphorus (P) or 0.5 to 2 atom % of carbon (C).

5. The ferroelectric semiconductor device of claim 1, wherein the active region includes a trench defined by the source/drain regions,
wherein
the trench includes
a first side surface connected to an upper surface of the active region,
a second side surface connected to a lower end of the first side surface, and
an edge between the first side surface and the second side surface; and
the upper surface of the active region, the first side surface, the second side surface, and the edge of the active region, and a lateral line aligned with a lower surface of the trench together form a sigma (Σ) shaped profile.

6. The ferroelectric semiconductor device of claim 5, wherein a lateral distance between a vertical line, which is perpendicular to the upper surface of the active region and aligned with an inner sidewall of the gate spacer, and the edge ranges from −3 to +5 nm.

7. The ferroelectric semiconductor device of claim 1, wherein the active region includes a plurality of channel layers on the substrate spaced apart from each other in a vertical direction, and
the gate insulating layer, the ferroelectric layer, and the gate electrode layer surround the plurality of channel layers.

8. A ferroelectric semiconductor device comprising:
an active region extending in one direction;
a gate structure crossing the active region;
a gate spacer covering both sidewalls of the gate structure; and
source/drain regions on both sides of the gate spacer,
the gate structure includes
an interface layer in contact with the active region,
a gate electrode layer on the interface layer, and
a gate insulating layer and a ferroelectric layer between the interface layer and the gate electrode layer,
the gate insulating layer and the ferroelectric layer extend along an inner sidewall of the gate spacer and have a U-shaped cross section,
the ferroelectric layer includes an oxide, the oxide being hafnium oxide ($HfO_2$) or $Hf_aZr_{1-a}O_b$ ([a]=0.2 to 0.8 and [b]=2 to 4), the hafnium oxide ($HfO_2$) being doped with at least one of 3 to 8 mol % of aluminum (Al), 2 to 10 mol % of silicon (Si), 2 to 10 mol % of iridium (Y), 1 to 7 mol % of lanthanum (La), and 1 to 7 mol % of gadolinium (Gd), and
an upper surface of the source/drain region is located at a level between an upper end and a bottom surface of the ferroelectric layer.

9. The ferroelectric semiconductor device of claim 8, wherein 20% or more of the ferroelectric layer includes orthorhombic crystals.

10. The ferroelectric semiconductor device of claim 8, wherein the ferroelectric layer is on the gate insulating layer and surrounds both sidewalls of the gate electrode layer.

11. The ferroelectric semiconductor device of claim 8, wherein the interface layer includes a material having the same lattice constant as the active region.

12. The ferroelectric semiconductor device of claim 8, wherein the source/drain region include
a first epitaxial layer having a germanium (Ge) content of 25 to 35 atom %; and
a second epitaxial layer on the first epitaxial layer and having a germanium (Ge) content of 50 to 70 atom %.

13. The ferroelectric semiconductor device of claim 8, wherein the source/drain region include silicon doped with 5 to 10 atom % of phosphorus (P) or 0.5 to 2 atom % of carbon (C).

14. The ferroelectric semiconductor device of claim 8, wherein a lateral distance between a portion of the source/drain region and a vertical line which is perpendicular to an upper surface of the active region and aligned with a side surface of the gate electrode layer ranges from −3 to +5 nm, the portion of the source/drain regions being a portion protruding most in an inward direction of the gate structure, and
a vertical distance between a lower end of the source/drain region and a lateral line which is aligned with the upper surface of the active region ranges from 40 to 65 nm.

15. The ferroelectric semiconductor device of claim 8, wherein the active region includes a trench defined by the source/drain regions,
wherein the trench includes a first side surface connected to an upper surface of the active region, a second side surface connected to a lower end of the first side surface, and an edge between the first side surface and the second side surface, and the upper surface of the active region, the first side surface, the second side surface, and the edge of the active region, and a lateral line aligned with a lower surface of the trench together form a sigma ($\Sigma$) shaped profile.

16. A method of manufacturing a ferroelectric semiconductor device, the method comprising:

providing a substrate having an active region;

forming a gate insulating layer on the active region;

forming an amorphous ferroelectric layer including a hafnium oxide on the gate insulating layer;

forming a gate electrode layer on the ferroelectric layer;

forming a trench in the active region to be adjacent to both sides of the gate insulating layer; and forming an embedded stressor in the trench and converting the amorphous ferroelectric layer into a crystalline ferroelectric layer, wherein the forming of the amorphous ferroelectric layer includes at least one of doping the hafnium oxide with 3 to 8 mol % of aluminum (Al) and annealing in a range from 800 to 1,000° C., doping the hafnium oxide with 2 to 10 mol % of silicon (Si) and annealing in a range from 650 to 1,000° C., doping the hafnium oxide with 2 to 10 mol % of iridium (Y) and annealing in a range from 600 to 1,000° C., or doping the hafnium oxide with 1 to 7 mol % of gadolinium (Gd) and annealing in a range from 450 to 800° C., and a vertical height of an upper surface of the embedded stressor from an upper end of the active region ranges from 1 to 25 nm.

17. The method of claim 16, wherein 20% or more of the crystalline ferroelectric layer includes orthorhombic crystals.

18. The method of claim 16, wherein the embedded stressor is configured to apply a strain ranging from 1 to 4.5 Gpa to the ferroelectric layer.

19. The method of claim 18, wherein:

a lateral distance between a vertical line, which is perpendicular to an upper surface of the active region and aligned with a side surface of the gate insulating layer, and portion of the embedded stressor ranges from −3 to +5 nm, the portion of the embedded stressor being a portion protruding most in an inward direction of the gate insulating layer; and a vertical depth of a lower end of the embedded stressor from the upper end of the active region ranges from 40 to 65 nm.

20. The method of claim 18, wherein the active region has a sigma ($\Sigma$) shaped profile formed by the trench.

* * * * *